United States Patent
Feng

(10) Patent No.: US 11,475,825 B2
(45) Date of Patent: Oct. 18, 2022

(54) SHIFT REGISTER UNIT, GATE DRIVING CIRCUIT, DISPLAY DEVICE, AND DRIVING METHOD

(71) Applicants: Hefei Xinsheng Optoelectronics Technology Co., Ltd., Anhui (CN); Beijing BOE Technology Development Co., Ltd., Beijing (CN)

(72) Inventor: Xuehuan Feng, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 327 days.

(21) Appl. No.: 16/485,719

(22) PCT Filed: Jan. 24, 2019

(86) PCT No.: PCT/CN2019/072992
§ 371 (c)(1),
(2) Date: Aug. 13, 2019

(87) PCT Pub. No.: WO2020/001012
PCT Pub. Date: Jan. 2, 2020

(65) Prior Publication Data
US 2021/0335198 A1 Oct. 28, 2021

(30) Foreign Application Priority Data

Jun. 28, 2018 (CN) .......................... 201810691084.6

(51) Int. Cl.
*G09G 3/3266* (2016.01)
*G09G 3/20* (2006.01)

(52) U.S. Cl.
CPC ... *G09G 3/2092* (2013.01); *G09G 2300/0426* (2013.01); *G09G 2310/0286* (2013.01);
(Continued)

(58) Field of Classification Search
CPC ......... G09G 3/2092; G09G 2300/0426; G09G 2310/0286; G09G 2310/061;
(Continued)

(56) References Cited

U.S. PATENT DOCUMENTS 9,336,899 B2 * 5/2016 Ochiai ................... G09G 5/003
9,524,686 B2 12/2016 Zhang et al.
(Continued)

FOREIGN PATENT DOCUMENTS

CN 102800292 A 11/2012
CN 104036738 A 9/2014
(Continued)

OTHER PUBLICATIONS

Oct. 10, 2020—(CN) First Office Action 201810691084.6 with English Translation.
(Continued)

*Primary Examiner* — Jose R Soto Lopez
(74) *Attorney, Agent, or Firm* — Banner & Witcoff, Ltd.

(57) ABSTRACT

A shift register unit, a gate driving circuit, a display device, and a driving method are disclosed. The shift register unit includes a blanking input circuit, a display input circuit, an output circuit, and a coupling circuit. The blanking input circuit is configured to input a blanking input signal to a control node and is configured to input a blanking signal to a first node in a blanking phase of one frame; the display input circuit is configured to input a display signal to the first node in a display phase of one frame in response to a first clock signal; and the coupling circuit is electrically connected to the control node and is configured to control, by coupling, a level of the control node in response to the blanking signal.

19 Claims, 12 Drawing Sheets

(52) U.S. Cl.
CPC ... *G09G 2310/061* (2013.01); *G09G 2310/08* (2013.01); *G09G 2320/0214* (2013.01)

(58) Field of Classification Search
CPC ....... G09G 2310/08; G09G 2320/0214; G09G 3/3266; G11C 19/28
See application file for complete search history.

(56) References Cited

U.S. PATENT DOCUMENTS

| | | | |
|---|---|---|---|
| 9,570,030 B2* | 2/2017 | Iwamoto | G09G 3/3688 |
| 9,685,134 B2* | 6/2017 | Zhang | G09G 3/3677 |
| 9,875,712 B2 | 1/2018 | Ma et al. | |
| 10,170,069 B2 | 1/2019 | Xue et al. | |
| 10,224,112 B2 | 3/2019 | Hao et al. | |
| 10,269,290 B2* | 4/2019 | Shang | G11C 19/28 |
| 10,510,428 B2* | 12/2019 | Wang | G11C 19/28 |
| 10,572,038 B2 | 2/2020 | Gu et al. | |
| 10,573,224 B2 | 2/2020 | Hao et al. | |
| 10,665,196 B2* | 5/2020 | Takahashi | G09G 3/36 |
| 10,909,942 B2* | 2/2021 | Takahashi | G11C 19/28 |
| 2006/0139293 A1* | 6/2006 | Cho | G11C 19/00 345/100 |
| 2010/0245301 A1* | 9/2010 | Shang | G09G 3/3677 345/204 |
| 2012/0027160 A1 | 2/2012 | Tobita | |
| 2012/0249502 A1* | 10/2012 | Takahashi | G09G 3/3677 345/205 |
| 2017/0003807 A1* | 1/2017 | Abe | G06F 3/04166 |
| 2017/0069283 A1* | 3/2017 | You | G09G 3/2092 |
| 2017/0076683 A1* | 3/2017 | Lee | G09G 3/3266 |
| 2017/0236480 A1* | 8/2017 | Dai | G09G 3/3677 345/213 |
| 2017/0270879 A1* | 9/2017 | Han | G09G 3/3677 |
| 2017/0287425 A1* | 10/2017 | Koo | G09G 3/3688 |
| 2017/0372654 A1 | 12/2017 | So et al. | |
| 2018/0090043 A1* | 3/2018 | Zhou | G09G 3/3677 |
| 2018/0182300 A1* | 6/2018 | Chen | G09G 3/3674 |
| 2018/0190173 A1* | 7/2018 | Feng | G09G 3/20 |
| 2018/0337682 A1* | 11/2018 | Takasugi | H03K 21/18 |
| 2019/0096350 A1 | 3/2019 | Zhao et al. | |
| 2019/0139475 A1* | 5/2019 | Wang | G11C 7/02 |
| 2019/0156778 A1 | 5/2019 | Li et al. | |
| 2019/0206504 A1 | 7/2019 | Tao et al. | |
| 2020/0082747 A1* | 3/2020 | Tian | G11C 19/28 |
| 2020/0211669 A1* | 7/2020 | Li | G09G 3/20 |
| 2020/0219576 A1* | 7/2020 | Yao | G09G 3/20 |
| 2020/0286420 A1* | 9/2020 | Bai | G11C 19/28 |
| 2021/0012847 A1* | 1/2021 | Cheng | G11C 19/28 |
| 2021/0183326 A1* | 6/2021 | Fu | G09G 3/3677 |

FOREIGN PATENT DOCUMENTS

| | | |
|---|---|---|
| CN | 104900211 A | 9/2015 |
| CN | 105096879 A | 11/2015 |
| CN | 106023943 A | 10/2016 |
| CN | 106486082 A | 3/2017 |
| CN | 106847221 A | 6/2017 |
| CN | 107464539 A | 12/2017 |
| CN | 107705762 A | 2/2018 |
| CN | 107958649 A | 4/2018 |
| CN | 108806611 A | 11/2018 |
| EP | 3754643 A1 | 12/2020 |
| KR | 20170078978 A | 7/2017 |
| KR | 1020180069270 A | 6/2018 |
| WO | 2017107555 A1 | 6/2017 |
| WO | 2017113984 A1 | 7/2017 |
| WO | 2018099047 A1 | 6/2018 |

OTHER PUBLICATIONS

May 24, 2021—(KR) First Office Action Appn No. 10-2020-7017997 with English Translation.
Aug. 19, 2021—IN—First Office Action Appn 201947034666 with English Translation.
Feb. 21, 2022—(EP) Extended European Search Report Appn 19748643.4.

* cited by examiner

SHIFT REGISTER UNIT, GATE DRIVING CIRCUIT, DISPLAY DEVICE, AND DRIVING METHOD

The application is a U.S. National Phase Entry of International Application No. PCT/CN2019/072992 filed on Jan. 24, 2019, designating the United States of America and claiming priority to Chinese Patent Application No. 201810691084.6, filed on Jun. 28, 2018. The present application claims priority to and the benefit of the above—identified applications and the above-identified applications are incorporated by reference herein in their entirety.

TECHNICAL FIELD

Embodiments of the present disclosure relate to a shift register unit, a gate driving circuit, a display device, and a driving method.

BACKGROUND

Currently in the display field, especially in an OLED (organic light-emitting diode) display panel, a gate driving circuit is generally integrated in a GATE IC. The area of a chip in IC design is a main factor affecting the cost of the chip, and technology developers need to focus on how to effectively reduce the area of the chip.

SUMMARY

At least an embodiment of the present disclosure provides a shift register unit, comprising a blanking input circuit, a display input circuit, an output circuit, and a coupling circuit. The blanking input circuit is configured to input a blanking input signal to a control node and is configured to input a blanking signal to a first node in a blanking phase of one frame; the display input circuit is configured to input a display signal to the first node in a display phase of one frame in response to a first clock signal; the output circuit is configured to output a composite output signal to an output terminal under control of a level of the first node; and the coupling circuit is electrically connected to the control node and is configured to control, by coupling, a level of the control node in response to the blanking signal.

For example, in the shift register unit provided by an embodiment of the present disclosure, the coupling circuit comprises a first capacitor, a first electrode of the first capacitor is connected to a third clock signal terminal to receive a third clock signal and the third clock signal is used as the blanking signal, and a second electrode of the first capacitor is connected to the control node.

For example, in the shift register unit provided by an embodiment of the present disclosure, the coupling circuit comprises a first capacitor and a first transistor. A gate electrode of the first transistor is connected to the control node, a first electrode of the first transistor is connected to a third clock signal terminal to receive a third clock signal and the third clock signal is used as the blanking signal, a second electrode of the first transistor is connected to a first electrode of the first capacitor, and a second electrode of the first capacitor is connected to the control node.

For example, in the shift register unit provided by an embodiment of the present disclosure, the blanking input circuit comprises: a charging sub-circuit, configured to input the blanking input signal to the control node in response to a second clock signal; a storage sub-circuit, configured to store the blanking input signal input by the charging sub-circuit; and an isolation sub-circuit, configured to input the blanking signal to the first node under control of the level of the control node and a third clock signal.

For example, in the shift register unit provided by an embodiment of the present disclosure, the charging sub-circuit comprises a second transistor, a gate electrode of the second transistor is connected to a second clock signal terminal to receive the second clock signal, a first electrode of the second transistor is connected to a blanking input signal terminal to receive the blanking input signal, and a second electrode of the second transistor is connected to the control node; the storage sub-circuit comprises a second capacitor, a first electrode of the second capacitor is connected to the control node, and a second electrode of the second capacitor is connected to a first voltage terminal to receive a first voltage; and the isolation sub-circuit comprises a third transistor and a fourth transistor, a gate electrode of the third transistor is connected to the control node, a first electrode of the third transistor is connected to a third clock signal terminal to receive the third clock signal and the third clock signal is used as the blanking signal, a second electrode of the third transistor is connected to a first electrode of the fourth transistor, a gate electrode of the fourth transistor is connected to the third clock signal terminal to receive the third clock signal, and a second electrode of the fourth transistor is connected to the first node.

For example, in the shift register unit provided by an embodiment of the present disclosure, the display input circuit comprises a fifth transistor, and a gate electrode of the fifth transistor is connected to a first clock signal terminal to receive the first clock signal, a first electrode of the fifth transistor is connected to a display input signal terminal to receive the display signal, and a second electrode of the fifth transistor is connected to the first node.

For example, in the shift register unit provided by an embodiment of the present disclosure, the output terminal comprises a shift signal output terminal and a pixel signal output terminal, the shift signal output terminal and the pixel signal output terminal output the composite output signal, and the output circuit comprises a sixth transistor, a seventh transistor, and a third capacitor; a gate electrode of the sixth transistor is connected to the first node, a first electrode of the sixth transistor is connected to a fourth clock signal terminal to receive a fourth clock signal and the fourth clock signal is used as the composite output signal, and a second electrode of the sixth transistor is connected to the shift signal output terminal; a gate electrode of the seventh transistor is connected to the first node, a first electrode of the seventh transistor is connected to the fourth clock signal terminal to receive the fourth clock signal and the fourth clock signal is used as the composite output signal, and a second electrode of the seventh transistor is connected to the pixel signal output terminal; and a first electrode of the third capacitor is connected to the first node, and a second electrode of the third capacitor is connected to the second electrode of the sixth transistor.

For example, the shift register unit provided by an embodiment of the present disclosure further comprises a noise reduction circuit and a control circuit. The control circuit is configured to control a level of a second node under control of the level of the first node; and the noise reduction circuit is configured to perform noise reduction on the first node, the shift signal output terminal, and the pixel signal output terminal under control of the level of the second node.

For example, in the shift register unit provided by an embodiment of the present disclosure, the control circuit comprises an eighth transistor, a ninth transistor, and a tenth transistor, a gate electrode of the eighth transistor and a first electrode of the eighth transistor are connected and are configured to be connected to a seventh voltage terminal to receive a seventh voltage, and a second electrode of the eighth transistor is connected to the second node; a gate electrode of the ninth transistor and a first electrode of the ninth transistor are connected and are configured to be connected to an eighth voltage terminal to receive an eighth voltage, and a second electrode of the ninth transistor is connected to the second node; and a gate electrode of the tenth transistor is connected to the first node, a first electrode of the tenth transistor is connected to the second node, and a second electrode of the tenth transistor is connected to a fourth voltage terminal to receive a fourth voltage.

For example, in the shift register unit provided by an embodiment of the present disclosure, the noise reduction circuit comprises an eleventh transistor, a twelfth transistor, and a thirteenth transistor, a gate electrode of the eleventh transistor is connected to the second node, a first electrode of the eleventh transistor is connected to the first node, and a second electrode of the eleventh transistor is connected to a third voltage terminal to receive a third voltage; a gate electrode of the twelfth transistor is connected to the second node, a first electrode of the twelfth transistor is connected to the shift signal output terminal, and a second electrode of the twelfth transistor is connected to a fifth voltage terminal to receive a fifth voltage; and a gate electrode of the thirteenth transistor is connected to the second node, a first electrode of the thirteenth transistor is connected to the pixel signal output terminal, and a second electrode of the thirteenth transistor is connected to a sixth voltage terminal to receive a sixth voltage For example, the shift register unit provided by an embodiment of the present disclosure further comprises a display reset circuit, and the display reset circuit is configured to reset the first node in response to a display reset signal.

For example, in the shift register unit provided by an embodiment of the present disclosure, the display reset circuit comprises a fourteenth transistor; and a gate electrode of the fourteenth transistor is connected to a display reset signal terminal to receive the display reset signal, a first electrode of the fourteenth transistor is connected to the first node, and a second electrode of the fourteenth transistor is connected to a second voltage terminal to receive a second voltage.

For example, the shift register unit provided by an embodiment of the present disclosure further comprises a total reset circuit, and the total reset circuit is configured to reset the control node in response to a total reset signal.

For example, in the shift register unit provided by an embodiment of the present disclosure, the total reset circuit comprises a fifteenth transistor, and a gate electrode of the fifteenth transistor is connected to a total reset signal terminal to receive the total reset signal, a first electrode of the fifteenth transistor is connected to the control node, and a second electrode of the fifteenth transistor is connected to a first voltage terminal to receive a first voltage.

At least an embodiment of the present disclosure further provides a gate driving circuit, comprising a plurality of cascaded shift register units provided by any one of the embodiments of the present disclosure.

For example, the gate driving circuit provided by an embodiment of the present disclosure further comprises a first sub-clock signal line, a second sub-clock signal line, a third sub-clock signal line, and a fourth sub-clock signal line. A (2n−1)th shift register unit is connected to the first sub-clock signal line to receive a first clock signal, and the (2n−1)th shift register unit is connected to the third sub-clock signal line to receive a fourth clock signal; a (2n)th shift register unit is connected to the second sub-clock signal line to receive a first clock signal, and the (2n)th shift register unit is connected to the fourth sub-clock signal line to receive a fourth clock signal; and n is an integer greater than zero.

For example, the gate driving circuit provided by an embodiment of the present disclosure further comprises a fifth sub-clock signal line, a sixth sub-clock signal line, and a seventh sub-clock signal line. The (2n−1)th shift register unit is connected to the fifth sub-clock signal line to receive a second clock signal, and the (2n−1)th shift register unit is connected to the sixth sub-clock signal line to receive a third clock signal; the (2n)th shift register unit is connected to the sixth sub-clock signal line to receive a second clock signal, and the (2n)th shift register unit is connected to the fifth sub-clock signal line to receive a third clock signal; each shift register unit is connected to the seventh sub-clock signal line to receive a total reset signal; and n is an integer greater than zero.

At least an embodiment of the present disclosure further provides a display device, comprising the gate driving circuit provided by any one of the embodiments of the present disclosure.

At least an embodiment of the present disclosure further provides a driving method of the shift register unit, comprising: in the blanking phase of one frame, causing the coupling circuit to control, by coupling, the level of the control node in response to the blanking signal, causing the blanking input circuit to input the blanking signal to the first node, and causing the output circuit to output the composite output signal under control of the level of the first node.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
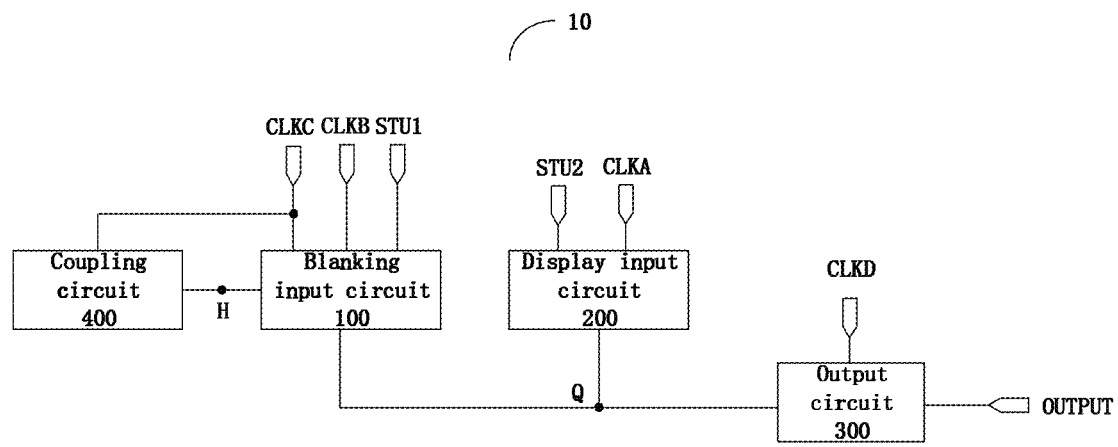
FIG. 1 is a schematic diagram of a shift register unit provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the embodiments of the present disclosure, for example, in a case where each circuit is implemented by an N-type transistor, the term "pull-up" means charging a node or an electrode of a transistor to allow the absolute value of the level of the node or the electrode to be increased, so as to implement a corresponding operation (e.g., turn-on) of the transistor, and the term "pull-down" means discharging a node or an electrode of a transistor to allow the absolute value of the level of the node or the electrode to be reduced, so as to implement a corresponding operation (e.g., turn-off) of the transistor.

For another example, in a case where each circuit is implemented by a P-type transistor, the term "pull-up" means discharging a node or an electrode of a transistor to allow the absolute value of the level of the node or the electrode to be reduced, so as to implement a corresponding operation (e.g., turn-on) of the transistor; and the term "pull-down" means charging a node or an electrode of a transistor to allow the absolute value of the level of the node or the electrode to be increased, so as to implement a corresponding operation (e.g., turn-off) of the transistor.

Moreover, the specific meanings of the terms "pull-up" and "pull-down" may further be accordingly adjusted based on the specific type of the transistor, as long as the transistor can be controlled to implement the corresponding switch function.

Currently, a gate driving circuit for OLED usually includes three sub-circuits, that is, a detecting circuit, a display circuit, and a connecting circuit (or a gate circuit) for outputting a composite pulse of the detecting circuit and the display circuit. The circuit structure of that gate driving circuit is very complicated and cannot satisfy the requirements for a high resolution and a narrow bezel.

When compensating a sub-pixel unit in the OLED display panel, in addition to setting a pixel compensating circuit in the sub-pixel unit for internal compensation, external compensation may also be performed by setting a sensing transistor. When the external compensation is performed, the gate driving circuit including shift register units needs to provide the sub-pixel unit in the display panel with a driving signal for a scanning transistor and a driving signal for the sensing transistor, respectively. For example, the gate driving circuit provides a scan driving signal for the scanning transistor in a display phase (DS) of one frame, and provides a sense driving signal for the sensing transistor in a blanking phase (BL) of one frame.

In a shift register unit, the transistor may have a threshold voltage drift (e.g., a negative drift), so leakage current may occur at a control node. For example, in the blanking phase of one frame, when leakage current occurs at the control node, the first node is not sufficiently charged, so that the shift register unit cannot normally output the sense driving signal for the sensing transistor.

In response to the above problems, at least an embodiment of the present disclosure provides a shift register unit, and the shift register unit includes a blanking input circuit, a display input circuit, an output circuit, and a coupling circuit. The blanking input circuit is configured to input a blanking input signal to a control node and is configured to input a blanking signal to a first node in a blanking phase of one frame; the display input circuit is configured to input a display signal to the first node in a display phase of one frame in response to a first clock signal; the output circuit is configured to output a composite output signal to an output terminal under control of a level of the first node; and the coupling circuit is electrically connected to the control node and is configured to control, by coupling, a level of the control node in response to the blanking signal. The embodiments of the present disclosure further provide a gate driving circuit, a display device, and a driving method corresponding to the shift register unit described above.

The shift register unit provided by the embodiment of the present disclosure can control, by coupling, the level of the control node in a case where the control node is at a high level, so as to allow the first node to be charged more sufficiently in the blanking phase of one frame to avoid an abnormal output.

It should be noted that, in the embodiments of the present disclosure, for the purpose of description, the term "one frame", "each frame" or "a frame" includes a display phase and a blanking phase which are sequentially performed. For example, in the display phase, the gate driving circuit outputs a display output signal, and the display output signal can drive the display panel from the first row to the last row to perform a scanning display of one complete image; and in the blanking phase, the gate driving circuit outputs a blanking output signal, and the blanking output signal can be used to drive sensing transistors in one row of sub-pixel units in the display panel to perform external compensation on the sub-pixel units in the row.

In the following, embodiments of the present disclosure and examples thereof will be described in detail with reference to the accompanying drawings.

At least an embodiment of the present disclosure provides a shift register unit 10, and as illustrated in FIG. 1, the shift register unit 10 includes a blanking input circuit 100, a display input circuit 200, an output circuit 300, and a coupling circuit 400. The blanking input circuit 100, the display input circuit 200, and the output circuit 300 are connected with each other through a first node Q.

The blanking input circuit 100 is configured to input a blanking input signal to a control node H and is configured to input a blanking signal to the first node Q in a blanking phase of one frame.

In some embodiments, the blanking input circuit 100 can be connected to a blanking input signal terminal STU1 and a second clock signal terminal CLKB, so that the blanking input signal input by the blanking input signal terminal STU1 is input to the control node H under control of the second clock signal input by the second clock signal terminal CLKB. The blanking input circuit 100 can further be connected to a third clock signal terminal CLKC, so that the third clock signal input by the third clock signal terminal CLKC is input to the first node Q as the blanking signal in the blanking phase of one frame, thereby allowing the level of the first node Q to be pulled up to a high level.

For example, in the blanking phase of one frame, the blanking input circuit 100 can receive the blanking input signal and store the blanking input signal; and in the blanking phase of the next frame, the blanking input circuit 100 can output the blanking signal to the first node Q according to the blanking input signal, thereby allowing the level of the first node Q to be pulled up to a high level.

For example, in a case where a plurality of shift register units 10 are cascaded to form a gate driving circuit, other than a first shift register unit, the blanking input signal terminal STU1 of each of the remaining shift register units can be electrically connected to an output terminal OUTPUT of a previous shift register unit. For example, in a case where the output terminal OUTPUT includes a shift signal output terminal CR and a pixel signal output terminal OUT, the blanking input signal terminal STU1 can be connected to the shift signal output terminal CR.

The display input circuit 200 is configured to input a display signal to the first node Q in a display phase of one frame in response to a first clock signal. For example, in some embodiments, the display input circuit 200 can be connected to a first clock signal terminal CLKA to receive the first clock signal, and the display input circuit 200 can further be connected to a display input signal terminal STU2 to receive the display signal. For example, in the display phase of one frame, the display input circuit 200 can input the display signal to the first node Q under control of the first clock signal, thereby allowing the level of the first node Q to be pulled up to a high level.

For example, in a case where a plurality of shift register units 10 are cascaded to form a gate driving circuit, other than a first shift register unit, the display input signal terminal STU2 of each of the remaining shift register units can be electrically connected to an output terminal OUTPUT of a previous shift register unit. For example, in a case where the output terminal OUTPUT includes the shift signal output terminal CR and the pixel signal output terminal OUT, the display input signal terminal STU2 can be connected to the shift signal output terminal CR.

It should be noted that, in the embodiments of the present disclosure, the display input circuit 200 can further use other configurations, as long as the corresponding functions can be implemented, and the embodiments of the present disclosure are not limited thereto.

The output circuit 300 is configured to output a composite output signal to the output terminal OUTPUT under control of a level of the first node Q. For example, in some embodiments, the output circuit 300 can be connected to a fourth clock signal terminal CLKD to receive a fourth clock signal as the composite output signal. For example, the composite output signal may include a display output signal and a blanking output signal, and in the display phase of one frame, the output circuit 300 outputs the display output signal to the output terminal OUTPUT under control of the level of the first node Q. For example, in some embodiments, the output terminal OUTPUT may include the shift signal output terminal CR and the pixel signal output terminal OUT, the display output signal output by the shift signal output terminal CR can be used for scanning shift of adjacent shift register units, and the display output signal output by the pixel signal output terminal OUT can be used to drive the sub-pixel units in the display panel to perform scanning display. In the blanking phase of one frame, the output circuit 300 outputs the blanking output signal to the output terminal OUTPUT under control of the level of the first node Q, and the blanking output signal can be used to drive the sensing transistor.

The coupling circuit 400 is electrically connected to the control node H, and is configured to control, by coupling, a level of the control node H in response to the blanking signal, for example, to pull up, by coupling, the level of the control node H. For example, in some embodiments, the coupling circuit 400 can be connected to the third clock signal terminal CLKC, and the third clock signal input by the third clock signal terminal CLKC can be used as the blanking signal. For example, in the blanking phase of one frame, the blanking input circuit 100 charges the control node H to allow the level of the control node H to be pulled up to a high level; and then in the blanking phase of a next frame, the coupling circuit 400 can pull up, by coupling, the level of the control node H in response to the blanking signal to avoid leakage current at the control node H, thereby allowing the first node Q to be charged more sufficiently in the blanking phase of the frame, so as to avoid the abnormal output.

In the shift register unit 10 provided by the embodiment of the present disclosure, by setting the coupling circuit 400, in a case where the control node H is at a high level, the level of the control node H can be further pulled up by coupling, so that in the blanking phase of one frame, the first node Q is charged more sufficiently to avoid the abnormal output.

Figure 2:
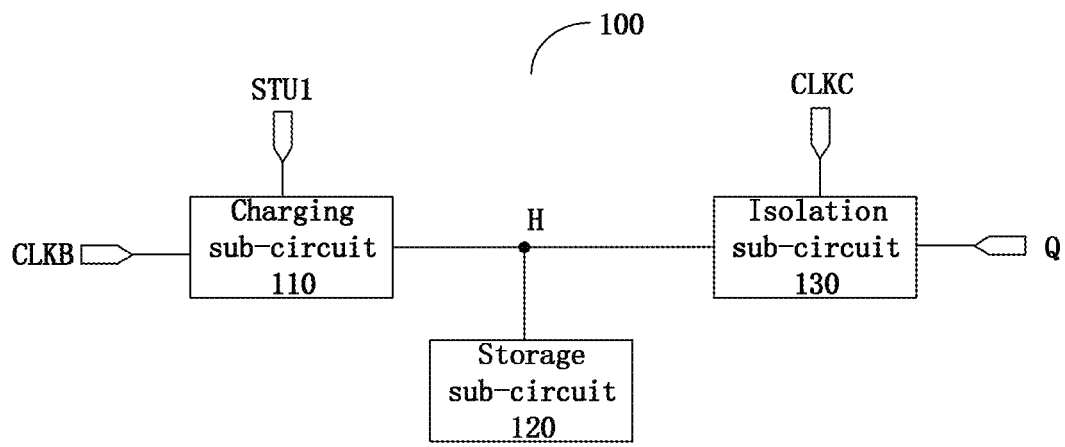
FIG. 2 is a schematic diagram of a blanking input circuit provided by some embodiments of the present disclosure.

In some embodiments of the present disclosure, as illustrated in FIG. 2, the blanking input circuit 100 includes a charging sub-circuit 110, a storage sub-circuit 120, and an isolation sub-circuit 130.

The charging sub-circuit 110 is configured to input the blanking input signal to the control node H in response to the second clock signal. For example, the charging sub-circuit 110 is connected to the blanking input signal terminal STU1 to receive the blanking input signal, and the charging sub-circuit 110 is connected to the second clock signal terminal CLKB to receive the second clock signal. For example, the charging sub-circuit 110 can be turned on under control of the second clock signal so that the blanking input signal can be input to the control node H.

The storage sub-circuit 120 is configured to store the blanking input signal input by the charging sub-circuit 110. For example, in the blanking phase of one frame, the level of the control node H is charged to a high level by the blanking input signal that is input, and the storage sub-circuit 120 can store the blanking input signal, thereby allowing the high level of the control node H to be maintained until the blanking phase of a next frame.

The isolation sub-circuit 130 is configured to input the blanking signal to the first node Q under control of the level of the control node H and the third clock signal. For example, in some embodiments, the isolation sub-circuit 130 is connected to the third clock signal terminal CLKC to receive the third clock signal and simultaneously further uses the third clock signal as the blanking signal.

For example, in the blanking phase of one frame, the isolation sub-circuit 130 is turned on under control of the level of the control node H and the third clock signal, so that the blanking signal can be input to the first node Q. For another example, in some embodiments, the isolation sub-circuit 130 is disposed between the first node Q and the control node H for preventing interaction between the first node Q and the control node H. For example, the isolation sub-circuit 130 can disconnect the connection between the first node Q and the control node H in a case where the blanking signal is not required to be output.

According to the shift register units 10 provided by the embodiments of the present disclosure, it is possible to control the level of the first node Q in different phases through the blanking input circuit 100 and the display input circuit 200, so that the blanking input circuit 100 and the display input circuit 200 can share the same output circuit 300 to implement the output of the composite output signal.

Figure 3:
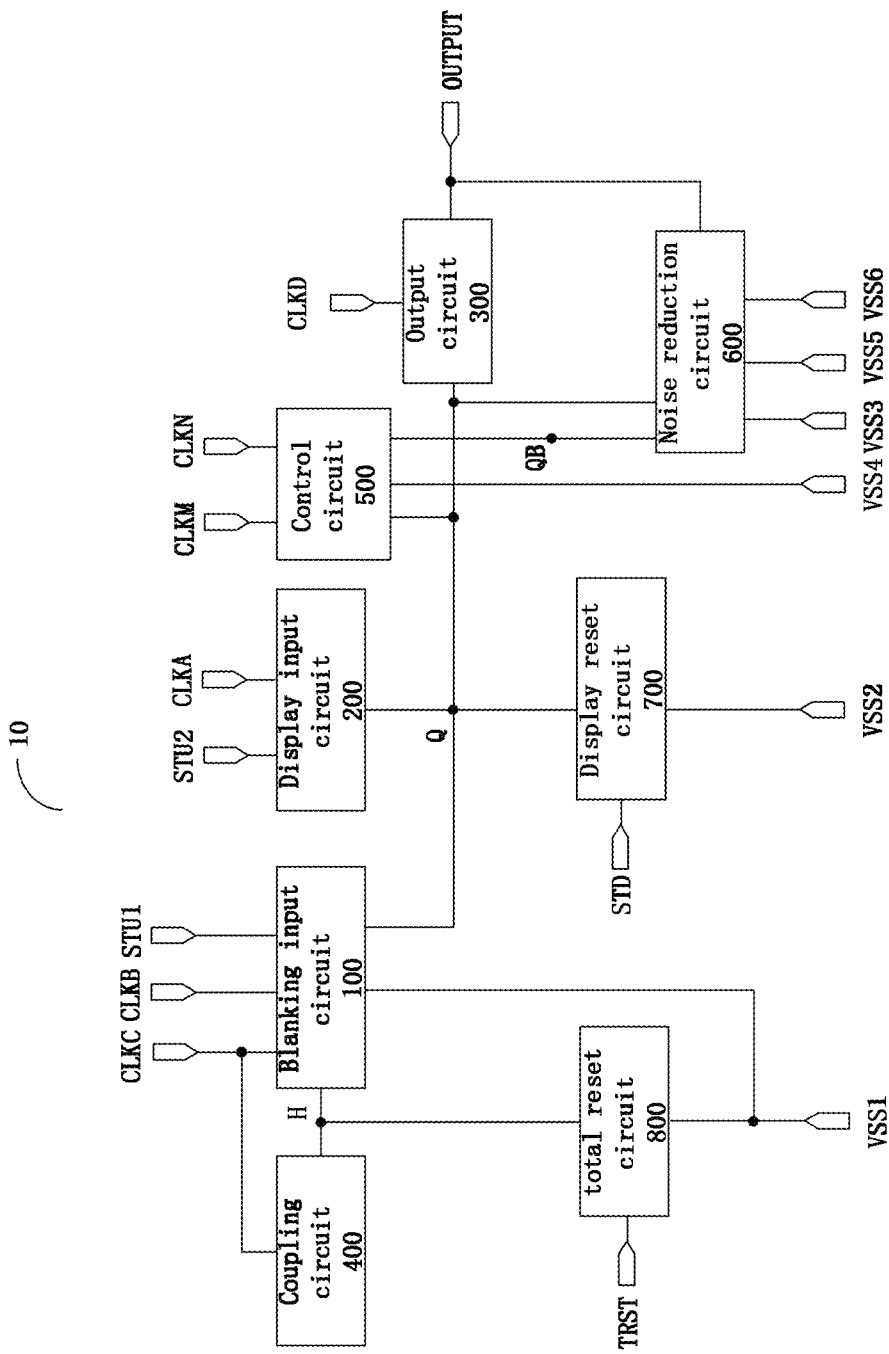
FIG. 3 is a schematic diagram of another shift register unit provided by some embodiments of the present disclosure.

In some embodiments, as illustrated in FIG. 3, the shift register unit 10 further includes a control circuit 500, and the control circuit 500 is configured to control a level of a second node QB under control of the level of the first node Q. For example, in some embodiments, the control circuit 500 is connected to a seventh voltage terminal CLKM and a fourth voltage terminal VSS4. It should be noted that, in the embodiments of the present disclosure, the fourth voltage terminal VSS4 can be configured to, for example, provide a DC low-level signal, which are the same in the following embodiments and will not be described again.

For example, in a case where the first node Q is at a high level, the control circuit 500 can pull down the level of the second node QB to a low level through the fourth voltage terminal VSS4. For another example, in a case where the first node Q is at a low level, the control circuit 500 can charge the second node QB by using the seventh voltage (e.g., a high level voltage) input by the seventh voltage terminal CLKM to pull up the level of the second node QB to a high level.

In some other embodiments, the control circuit 500 can further be connected to an eighth voltage terminal CLKN to receive an eighth voltage (e.g., a high-level voltage). For example, the seventh voltage terminal CLKM and the eighth voltage terminal CLKN can be configured to input the high-level voltage alternately, that is, in a case where the seventh voltage terminal CLKM inputs a high-level voltage, the eighth voltage terminal CLKN inputs a low-level voltage, and in a case where the seventh voltage terminal CLKM inputs a low-level voltage, the eighth voltage terminal CLKN inputs a high-level voltage.

In some embodiments, as illustrated in FIG. 3, the shift register unit 10 further includes a noise reduction circuit 600, and the noise reduction circuit 600 is configured to perform noise reduction on the first node Q and the output terminal OUTPUT under control of the level of the second node QB. For example, in a case where the output terminal OUTPUT includes the shift signal output terminal CR and the pixel signal output terminal OUT, the noise reduction circuit 600 can simultaneously perform noise reduction on the shift signal output terminal CR and the pixel signal output terminal OUT.

For example, the noise reduction circuit 600 is connected to a third voltage terminal VSS3, a fifth voltage terminal VSS5, and a sixth voltage terminal VSS6. In a case where the noise reduction circuit 600 is turned on under control of the level of the second node QB, the level of the first node Q, the level at the shift signal output terminal CR, and the level at the pixel signal output terminal OUT can be pulled down through the third voltage terminal VSS3, the fifth voltage terminal VSS5, and the sixth voltage terminal VSS6, respectively, thereby implementing noise reduction. It should be noted that in the embodiments of the present disclosure, the third voltage terminal VSS3, the fifth voltage terminal VSS5, and the sixth voltage terminal VSS6 can be configured to, for example, provide a DC low-level signal, which are the same in the following embodiments and will not be described again.

In some embodiments, as illustrated in FIG. 3, the shift register unit 10 can further include a display reset circuit 700, and the display reset circuit 700 is configured to reset the first node Q in response to a display reset signal. For example, in one example, the display reset circuit 700 may be connected to a display reset signal terminal STD to receive the display reset signal, and may be simultaneously connected to a second voltage terminal VSS2 to receive a second voltage of a low level. For example, in the display phase of one frame, the display reset circuit 700 can be turned on in response to the display reset signal, so that the first node Q can be reset through the second voltage terminal VSS2. For example, in a case where a plurality of shift register units 10 are cascaded to form a gate driving circuit, other than the last shift register unit, the display reset signal terminal STD of each of the remaining shift register units can be electrically connected to the output terminal OUTPUT (e.g., the shift signal output terminal CR) of a next shift register unit. It should be noted that in the embodiments of the present disclosure, the second voltage terminal VSS2 can be configured to, for example, provide the DC low-level signal, which are same in the following embodiments and will not be described again.

In some embodiments, as illustrated in FIG. 3, the shift register unit 10 further includes a total reset circuit 800, and the total reset circuit 800 is configured to reset the control node H in response to a total reset signal. For example, in one example, the total reset circuit 800 is connected to a total reset signal terminal TRST to receive the total reset signal, and is simultaneously connected to a first voltage terminal VSS1 to receive a first voltage of a low level. For example, in a case where a plurality of shift register units 10 are cascaded to form a gate driving circuit, prior to the display phase of one frame, the total reset circuit 800 in each shift register unit 10 is turned on in response to the total reset signal, and the control node H is reset through the first voltage terminal VSS1, thereby implementing the total reset of each shift register unit 10. It should be noted that in the embodiments of the present disclosure, the first voltage terminal VSS1 can be configured to, for example, provide the DC low-level signal, which are same in the following embodiments and will not be described again.

It should be noted that, in the embodiments of the present disclosure, for example, the low-level signal input by the first voltage terminal VSS1, the low-level signal input by the second voltage terminal VSS2, the low-level signal input by the third voltage terminal VSS3, the low-level signal input by the fourth voltage terminal VSS4, the low-level signal input by the fifth voltage terminal VSS5, and the low-level signal input by the sixth voltage terminal VSS6 can be the same, that is, the above six voltage terminals can be connected to a same signal line to receive a same low-level signal. For another example, two, three or more of the above six voltage terminals can be connected to a same signal line to receive a same low-level signal; and for further still another example, the above six voltage terminals can be connected to different signal lines to receive different low-level signals, respectively. The embodiments of the present disclosure do not limit the manners in which the first voltage terminal VSS1, the second voltage terminal VSS2, the third voltage terminal VSS3, the fourth voltage terminal VSS4, the fifth voltage terminal VSS5, and the sixth voltage terminal VSS6 are disposed.

It should be understood by those skilled in the art that although the shift register unit 10 illustrated in FIG. 3 shows the control circuit 500, the noise reduction circuit 600, the display reset circuit 700, and the total reset circuit 800, the above examples do not limit the protection scope of the present disclosure. In a practical application, those skilled in the art can select one or more of the above circuits according to a situation, and various combinations based on the above various circuits are not deviated from the principle of the present disclosure. Details are not described herein again.

Figure 4:
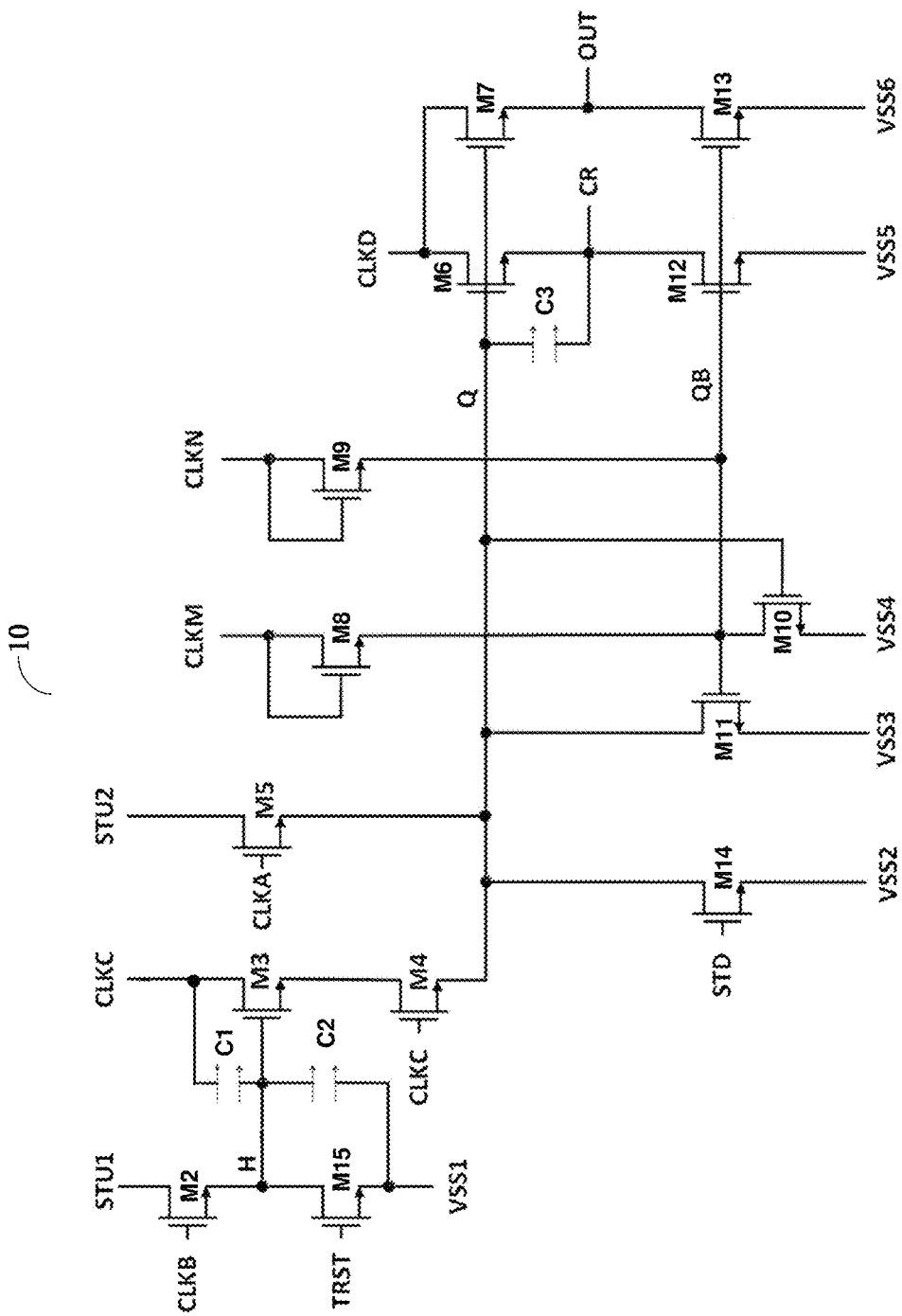
FIG. 4 is a circuit diagram of the shift register unit provided by some embodiments of the present disclosure.

In some embodiments of the present disclosure, the shift register unit 10 illustrated in FIG. 3 can be implemented as the circuit structure illustrated in FIG. 4. As illustrated in FIG. 4, the shift register unit 10 includes: second to fifteenth transistors M2-M15, a first capacitor C1, a second capacitor C2, and a third capacitor C3. The output terminal OUTPUT includes the shift signal output terminal CR and the pixel signal output terminal OUT, and both the shift signal output terminal CR and the pixel signal output terminal OUT can output the composite output signal. It should be noted that all the transistors illustrated in FIG. 4 are described by taking a N-type transistor as an example.

As illustrated in FIG. 4, the charging sub-circuit 110 of the blanking input circuit 100 can be implemented as the second transistor M2. A gate electrode of the second transistor M2 is connected to the second clock signal terminal CLKB to receive the second clock signal, a first electrode of the second transistor M2 is connected to the blanking input signal terminal STU1 to receive the blanking input signal, and a second electrode of the second transistor M2 is connected to the control node H. For example, in a case where the second clock signal is a high-level turn-on signal, the second transistor M2 is turned on under control of the second clock signal, so that the blanking input signal can be input to the control node H to allow the control node H to be charged.

As illustrated in FIG. 4, the storage sub-circuit 120 of the blanking input circuit 100 can be implemented as the second capacitor C2. A first electrode of the second capacitor C2 is connected to the control node H, and a second electrode of the second capacitor C2 is connected to the first voltage terminal VSS1 to receive the first voltage. The level of the control node H can be maintained by setting the second capacitor C2. For example, in the blanking phase of one frame, the charging sub-circuit 110 charges the control node H to allow the control node H to be at a high level, and the second capacitor C2 can maintain the high level of the control node H until the blanking phase to a next frame. It should be noted that, in the embodiments of the present disclosure, the second electrode of the second capacitor C2 can be connected to other voltage terminals in addition to the first voltage terminal VSS1, and for example, the second electrode of the second capacitor C2 is grounded. The embodiments of the present disclosure do not limit thereto.

As illustrated in FIG. 4, the isolation sub-circuit 130 of the blanking input circuit 100 can be implemented as the third transistor M3 and the fourth transistor M4. A gate electrode of the third transistor M3 is connected to the control node H, a first electrode of the third transistor M3 is connected to the third clock signal terminal CLKC to receive the third clock signal as the blanking signal, a second electrode of the third transistor M3 is connected to a first electrode of the fourth transistor M4, a gate electrode of the fourth transistor M4 is connected to the third clock signal terminal CLKC to receive the third clock signal, and a second electrode of the fourth transistor M4 is connected to the first node Q. For example, in the blanking phase of one frame, the third transistor M3 is turned on under control of the control node H, and in a case where the third clock signal is at a high level, the fourth transistor M4 is turned on under control of the third clock signal, so that the third clock signal acts as the blanking signal to charge the first node Q through the third transistor M3 and the fourth transistor M4.

As illustrated in FIG. 4, the display input circuit 200 can be implemented as the fifth transistor M5. A gate electrode of the fifth transistor M5 is connected to the first clock signal terminal CLKA to receive the first clock signal, a first electrode of the fifth transistor M5 is connected to the display input signal terminal STU2 to receive the display signal, and a second electrode of the fifth transistor M5 is connected to the first node Q. For example, in the display phase of one frame, the fifth transistor M5 is turned on under control of the first clock signal, thereby allowing the first node Q to be charged by using the display signal.

As illustrated in FIG. 4, the output circuit 300 can be implemented to include the sixth transistor M6, the seventh transistor M7, and the third capacitor C3. A gate electrode of the sixth transistor M6 is connected to the first node Q, a first electrode of the sixth transistor M6 is connected to the fourth clock signal terminal CLKD to receive the fourth clock signal as the composite output signal, and a second electrode of the sixth transistor M6 is connected to the shift signal output terminal CR. A gate electrode of the seventh transistor M7 is connected to the first node Q, a first electrode of the seventh transistor M7 is connected to the fourth clock signal terminal CLKD to receive the fourth clock signal as the composite output signal, and a second electrode of the seven transistor M7 is connected to the pixel signal output terminal OUT; and a first electrode of the third capacitor C3 is connected to the first node Q, and a second electrode of the third capacitor C3 is connected to the second electrode of the sixth transistor M6. For example, in a case where the level of the first node Q is a high level, the sixth transistor M6 and the seventh transistor M7 are turned on, so that the fourth clock signal can be output to the shift signal output terminal CR and the pixel signal output terminal OUT as the composite output signal.

As illustrated in FIG. 4, the control circuit 500 can be implemented to include the eighth transistor M8, the ninth transistor M9, and the tenth transistor M10. A gate electrode of the eighth transistor M8 and a first electrode of the eighth transistor M8 are connected, and are configured to be connected to the seventh voltage terminal CLKM to receive the seventh voltage, and a second electrode of the eighth transistor M8 is connected to the second node QB; a gate electrode of the ninth transistor M9 and a first electrode of the ninth transistor M9 are connected and are configured to be connected to the eighth voltage terminal CLKN to receive the eighth voltage, and a second electrode of the ninth transistor M9 is connected to the second node QB; and a gate electrode of the tenth transistor M10 is connected to the first node Q, a first electrode of the tenth transistor M10 is connected to the second node QB, and a second electrode of the tenth transistor M10 is connected to the fourth voltage terminal VSS4 to receive the fourth voltage.

For example, the seventh voltage terminal CLKM and the eighth voltage terminal CLKN can be configured to alternately input a high-level voltage, that is, in a case where the seventh voltage terminal CLKM inputs a high-level voltage, the eighth voltage terminal CLKN inputs a low-level voltage, and in a case where the seventh voltage terminal CLKM inputs a low-level voltage, the eighth voltage terminal CLKN inputs a high-level voltage. Therefore, only one of the eighth transistor M8 and the ninth transistor M9 is in a turn-on state, which can avoid performance drift caused by long-term turn-on of the transistor. In a case where the eighth transistor M8 or the ninth transistor M9 is turned on, the seventh voltage or the eighth voltage can charge the second node QB, thereby pulling up the level of the second node QB to a high level. In a case where the level of the first node Q is a high level, the tenth transistor M10 is turned on. For example, in the design of the transistor, the tenth transistor M10 and the eighth transistor M8 (or the ninth transistor M9) can be configured that (for example, the size ratio, the threshold voltage, etc.) in a case where both the tenth transistor M10 and the eighth transistor M8 (or the ninth transistor M9) are turned on, the level of the second node QB can be pulled down to a low level, which can cause the eleventh transistor M11, the twelfth transistor M12 and the thirteenth transistor M13 to maintain being turned off.

As illustrated in FIG. 4, the noise reduction circuit 600 can be implemented to include the eleventh transistor M11, the twelfth transistor M12, and the thirteenth transistor M13. A gate electrode of the eleventh transistor M11 is connected to the second node QB, a first electrode of the eleventh transistor M11 is connected to the first node Q, and a second electrode of the eleventh transistor M11 is connected to the third voltage terminal VSS3 to receive the third voltage; a gate electrode of the twelfth transistor M12 is connected to the second node QB, a first electrode of the twelfth transistor M12 is connected to the shift signal output terminal CR, and a second electrode of the twelfth transistor M12 is connected to the fifth voltage terminal VSS5 to receive the fifth voltage; and a gate electrode of the thirteenth transistor M13 is connected to the second node QB, a first electrode of the thirteenth transistor M13 is connected to the pixel signal output terminal OUT, and a second electrode of the thirteenth transistor M13 is connected to the sixth voltage terminal VSS6 to receive the sixth voltage.

For example, in a case where the level of the second node QB is at a high level, the eleventh transistor M11, the twelfth transistor M12, and the thirteenth transistor M13 are turned on, so that the level of the first node Q, the level at the shift signal output terminal CR, and the level at the pixel signal output terminal OUT can be pulled down by the third voltage, the fifth voltage, and the sixth voltage, respectively, to reduce noise.

As illustrated in FIG. 4, the display reset circuit 700 can be implemented as the fourteenth transistor M14. A gate electrode of the fourteenth transistor M14 is connected to the display reset signal terminal STD to receive the display reset signal, a first electrode of the fourteenth transistor M14 is connected to the first node Q, and a second electrode of the fourteenth transistor M14 is connected to the second voltage terminal VSS2 to receive the second voltage. For example, in a case where the display reset signal is at a high level, the fourteenth transistor M14 is turned on, so that the first node Q can be reset through the second voltage terminal VSS2.

As illustrated in FIG. 4, the total reset circuit 800 can be implemented as the fifteenth transistor M15. A gate electrode of the fifteenth transistor M15 is connected to the total reset signal terminal TRST to receive the total reset signal, a first electrode of the fifteenth transistor M15 is connected to the control node H, and a second electrode of the fifteenth transistor M15 is connected to the first voltage terminal VSS1 to receive the first voltage. For example, in a case where the total reset signal is at a high level, the fifteenth transistor M15 is turned on, so that the control node H can be reset through the first voltage terminal VSS1.

In some embodiments, as illustrated in FIG. 4, the coupling circuit 400 can be implemented as the first capacitor C1. A first electrode of the first capacitor C1 is electrically connected to the third clock signal terminal CLKC to receive the third clock signal and the third clock is used as the blanking signal, and a second electrode of the first capacitor C1 is connected to the control node H. For example, in a case where the control node H is at a high level, the third transistor M3 is turned on, and in a case where the third clock signal is at a high level, the fourth transistor M4 is turned on, so that the third clock signal of the high level is input to the first node Q as the blanking signal through the third transistor M3 and the fourth transistor M4 to charge the first node Q. Simultaneously, in a case where the third clock signal is at a high level, the high-level signal can further pull up, by coupling, the level of the control node H through the first capacitor C1, so that the third transistor M3 is more sufficiently turned on, and the first node Q is charged more sufficiently by the blanking signal to avoid the abnormal output.

Figure 5:
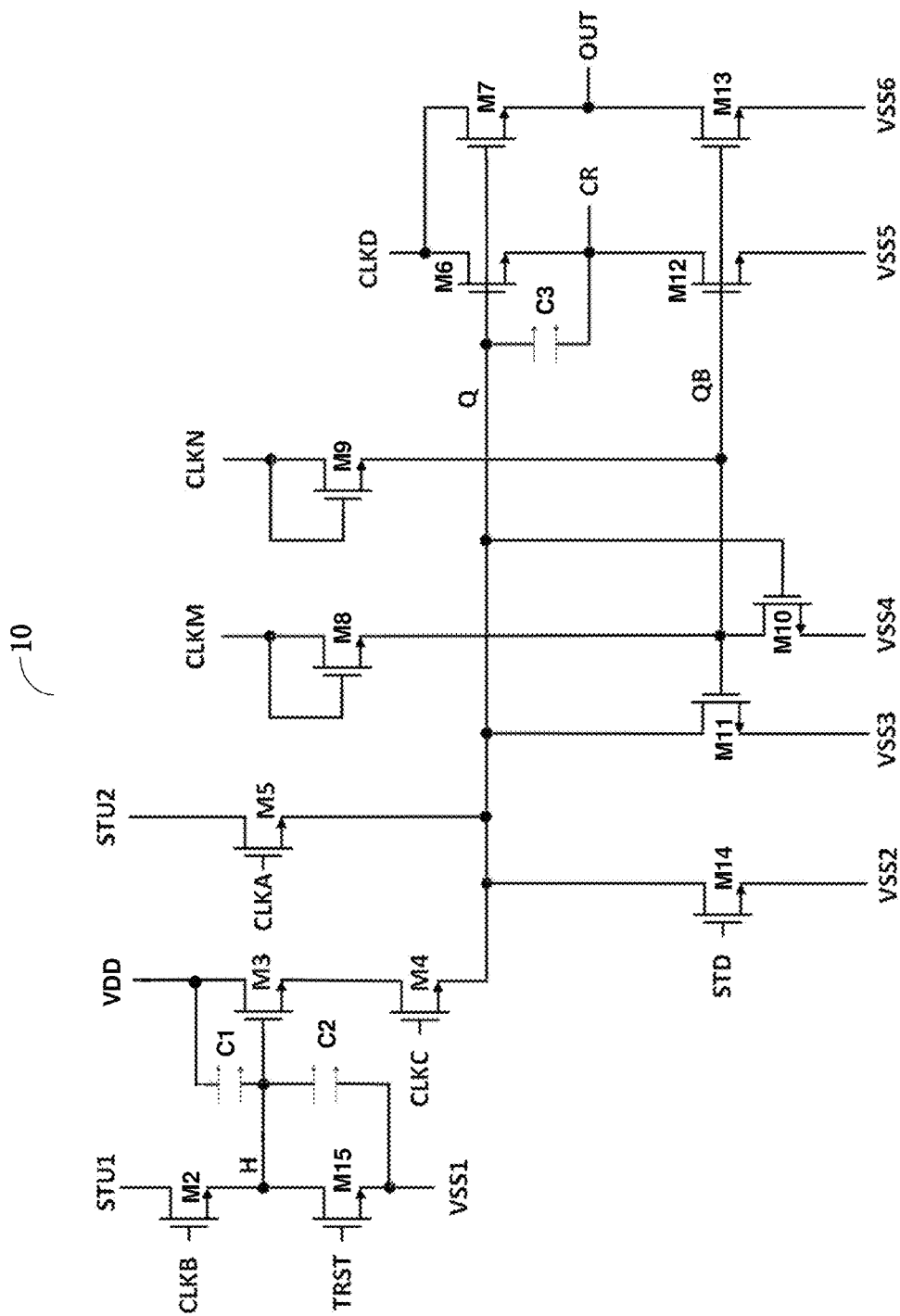
FIG. 5 is another circuit diagram of the shift register unit provided by some embodiments of the present disclosure.

In some other embodiments, as illustrated in FIG. 5, the first electrode of the first capacitor C1 can further be connected to the tenth voltage terminal VDD to receive the tenth voltage, and for example, the tenth voltage is a DC high-level voltage. It should be noted that the same components of the shift register unit illustrated in FIG. 5 can be with reference to those of the shift register unit illustrated in FIG. 4 described above, and details are not described herein again.

Figure 6:
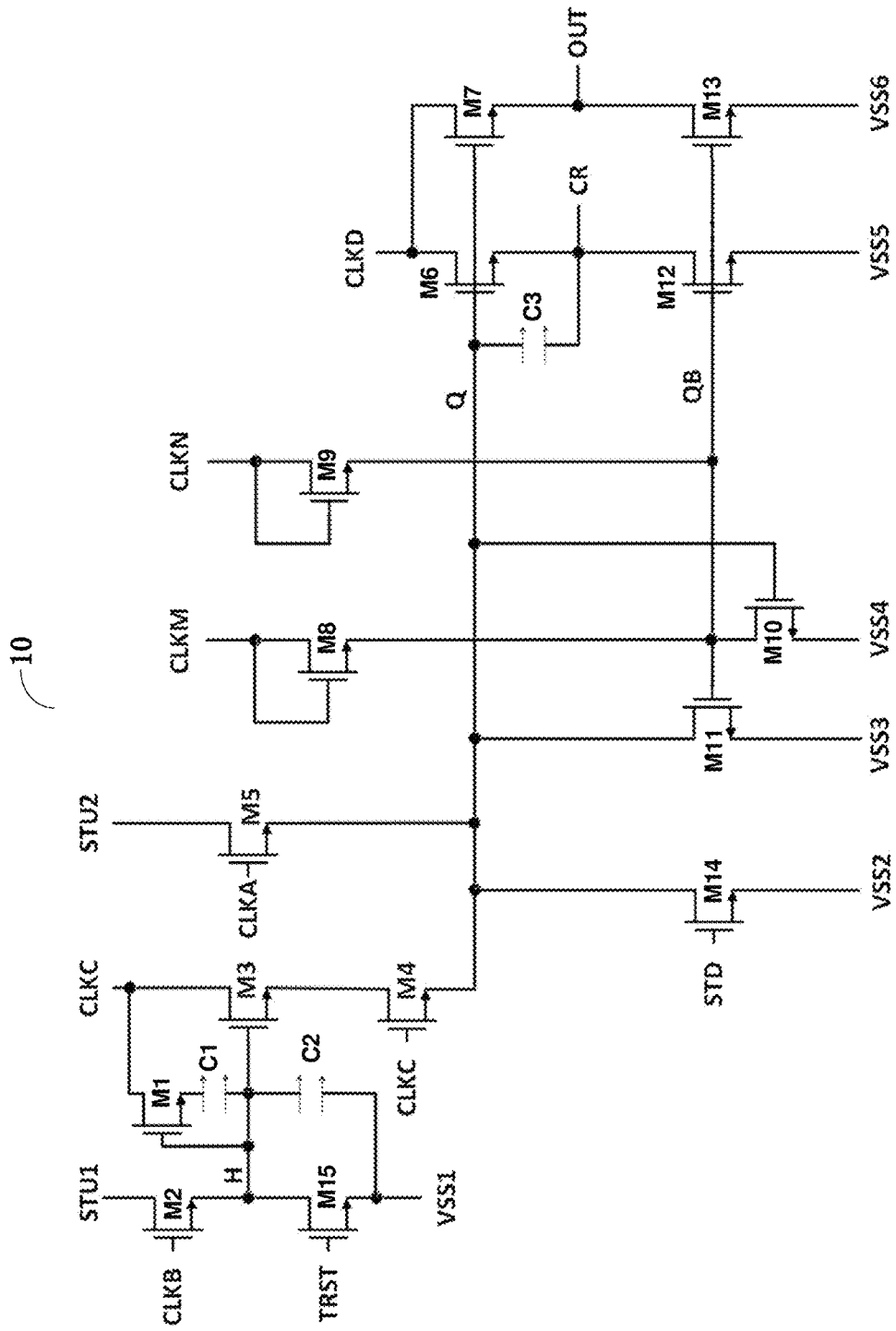
FIG. 6 is further still another circuit diagram of the shift register unit provided by some embodiments of the present disclosure.

In further still other embodiments, as illustrated in FIG. 6, the coupling circuit 400 can be implemented to include a first transistor M1 and the first capacitor C1. A gate electrode of the first transistor M1 is connected to the control node H, a first electrode of the first transistor M1 is connected to the third clock signal terminal CLKC to receive the third clock signal and the third clock signal is used as the blanking signal, a second electrode and the first transistor M1 is connected to a first electrode of the capacitor C1, and a second electrode of the first capacitor C1 is connected to the control node H. For example, in a case where the control node H is at a high level, the first transistor M1 is turned on, so that the third clock signal provided by the third clock signal terminal CLKC can be applied to the first electrode of the first capacitor C1. In a case where the third clock signal is at a high level, the high-level signal can further pull up, by coupling, the level of the control node H through the first capacitor C1, so that the third transistor M3 is turned on more sufficiently, and the first node Q is charged more sufficiently by the blanking signal to avoid the abnormal output.

It should be noted that the same components of the shift register unit illustrated in FIG. 6 can be with reference to those of the shift register unit illustrated in FIG. 4 described above, and details are not described herein again.

Figure 7:
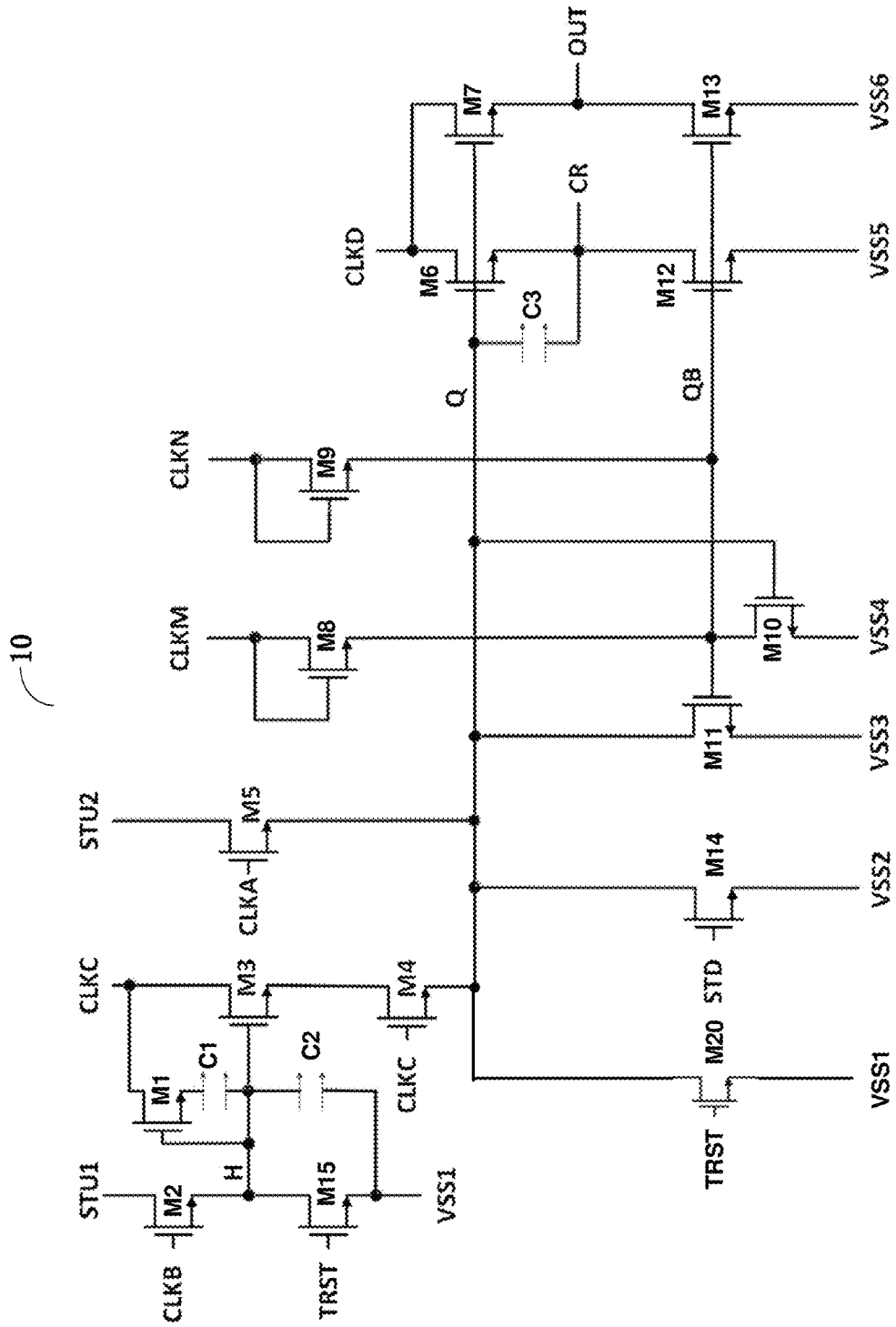
FIG. 7 is further still another circuit diagram of the shift register unit provided by some embodiments of the present disclosure.

In the shift register unit 10 provided by some other embodiments, as illustrated in FIG. 7, compared with the shift register unit 10 illustrated in FIG. 6, the shift register unit 10 further includes a twentieth transistor M20. A gate electrode of the twentieth transistor M20 is connected to the total reset signal terminal TRST to receive the total reset signal, a first electrode of the twentieth transistor M20 is connected to the first node Q, and a second electrode of the twentieth transistor M20 is connected to the first voltage terminal VSS1 to receive the first voltage. For example, in a case where a plurality of shift register units 10 illustrated in FIG. 7 are cascaded to form a gate driving circuit, prior to the display phase of one frame, the fifteenth transistor M15 and the twentieth transistor M20 in each of the shift register units 10 are turned on in response to the total reset signal, and the control node H and the first node Q are simultaneously reset through the first voltage terminal VSS1, thereby implementing the total reset of each shift register unit 10.

It should be noted that, in FIG. 7, the second electrode of the twentieth transistor M20 is connected to the first voltage terminal VSS1, and the embodiments of the present disclosure include but are not limited thereto. For example, the second electrode of the twentieth transistor M20 can further be connected to any one of the second voltage terminal VSS2, the third voltage terminal VSS3, the fourth voltage terminal VSS4, the fifth voltage terminal VSS5, and the sixth voltage terminal VSS6 to receive a DC low-level signal.

Figure 12:
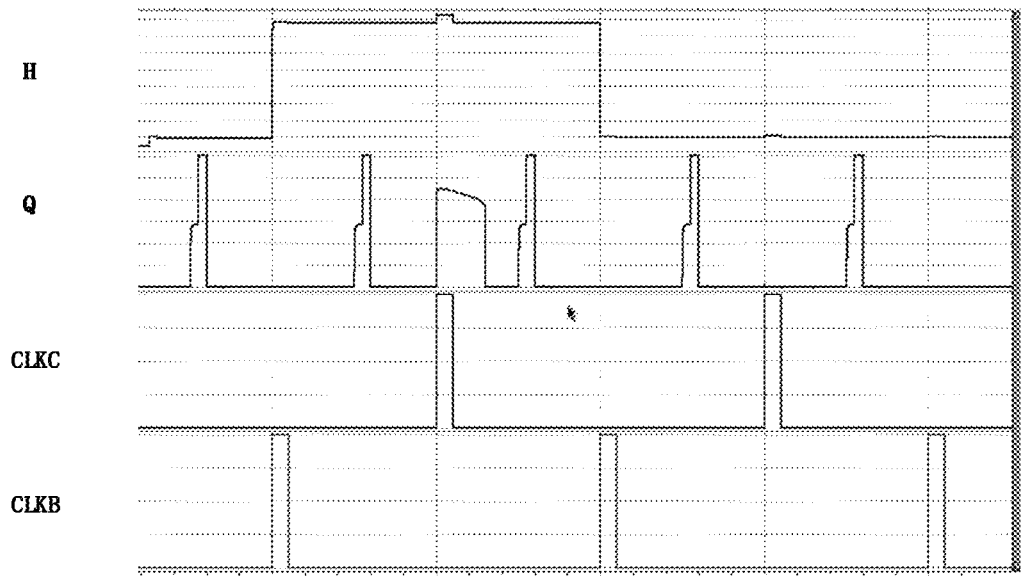
FIG. 12 is a signal simulation diagram of the shift register unit illustrated in FIG. 4 without including a first capacitor.

The examples illustrated in FIG. 4 and FIG. 6 are further described below with reference to the signal simulation diagrams illustrated in FIG. 12, FIG. 13, and FIG. 14. FIG. 12 is a signal simulation diagram of the shift register unit 10 illustrated in FIG. 4 without including the first capacitor C1 (i.e., without including the coupling circuit 400), FIG. 13 is a signal simulation diagram of the shift register unit 10 (in a case where the coupling circuit 400 includes the first capacitor C1) illustrated in FIG. 4, and FIG. 14 is a signal simulation diagram of the shift register unit 10 (in a case where the coupling circuit 400 includes the first capacitor C1 and the first transistor M1) illustrated in FIG. 6.

Figure 13:
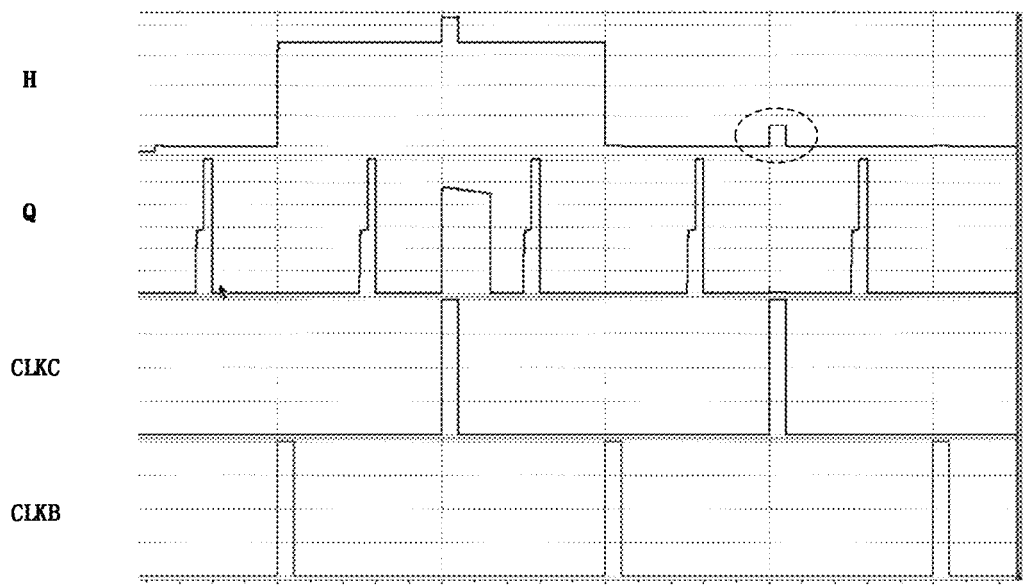
FIG. 13 is a signal simulation diagram of the shift register unit illustrated in FIG. 4.
Figure 14:
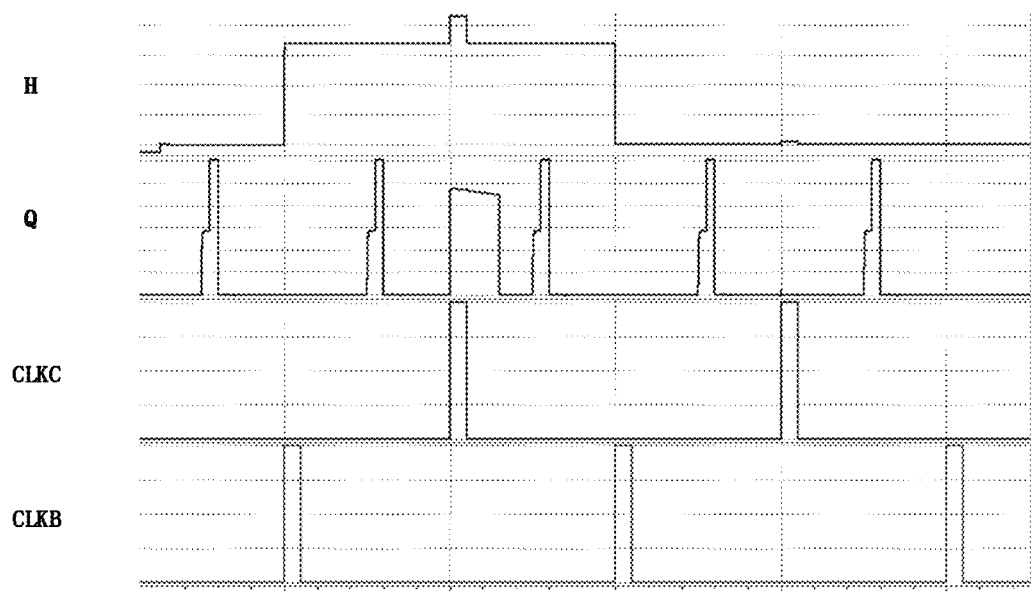
FIG. 14 is a signal simulation diagram of the shift register unit illustrated in FIG. 6.

In a case where the coupling circuit 400 is provided, as seen from FIG. 13 and FIG. 14, in a case where the control node H is at a high level and the third clock signal provided by the third clock signal terminal CLKC is at a high level, the level of the control node H is further pulled up by coupling, so that the first node Q is charged more sufficiently (i.e., the level of the first node Q is higher), thereby avoiding the abnormal output.

In addition, as illustrated in FIG. 13, in a case where the coupling circuit 400 only includes the first capacitor C1 and does not include the first transistor M1, where the level of the control node H becomes a low level and the third clock signal provided by the third clock signal terminal CLKC is at a high level, the high-level signal pulls up, by coupling, the level of the control node H through the first capacitor C1 (as indicated by the dashed oval in FIG. 13), thereby bringing noise to the control node H.

As illustrated in FIG. 14, in a case where the coupling circuit 400 includes the first capacitor C1 and the first transistor M1, where the control node H becomes at a low level, the first transistor M1 is turned off. Therefore, even at that time the third clock signal provided by the third clock signal terminal CLKC is at a high level, the high-level signal cannot pull up, by coupling, the level of the control node H through the first capacitor C1 (with reference to the shift register unit illustrated in FIG. 6), that is, noise is not brought to the control node H.

Figure 8:
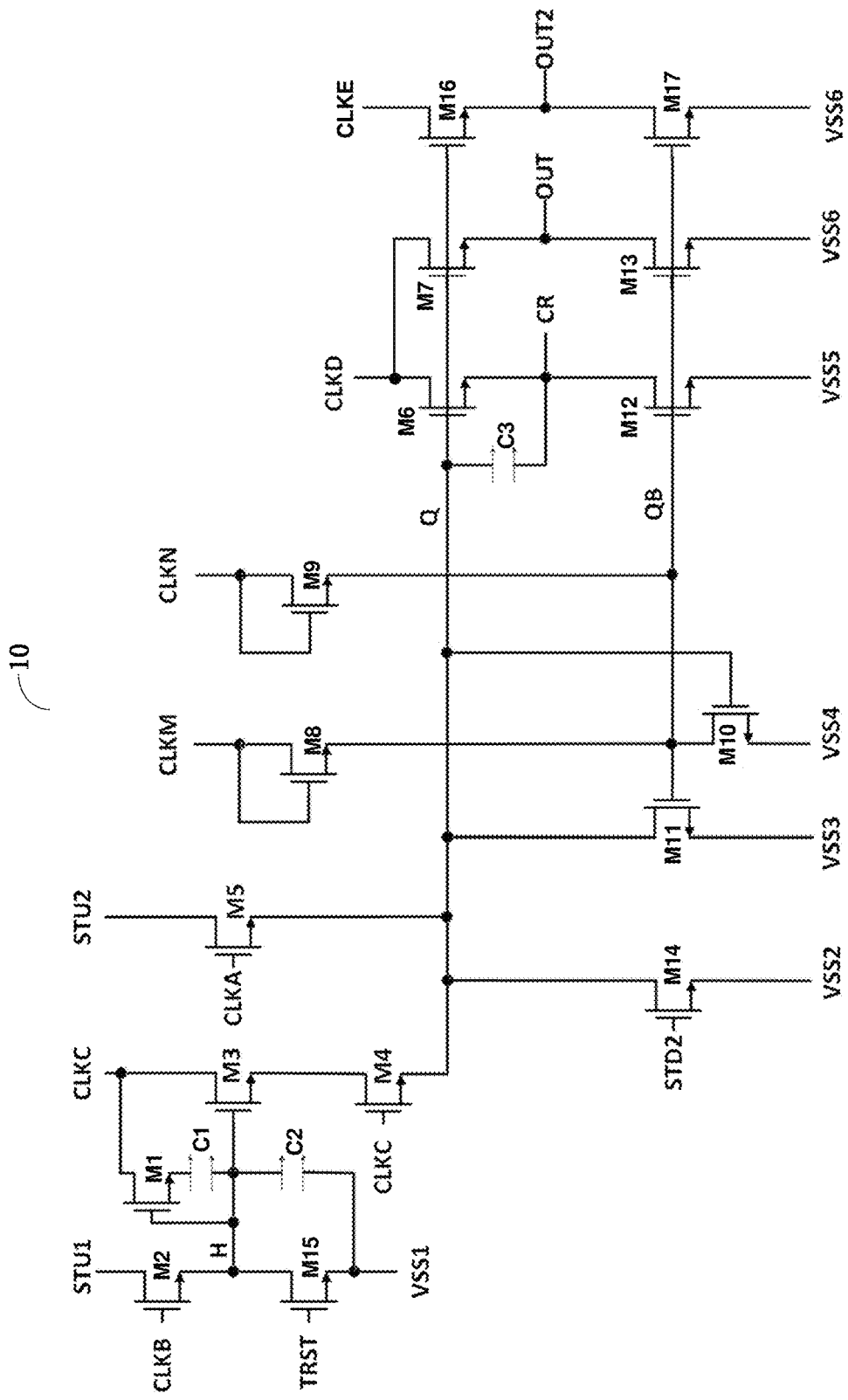
FIG. 8 is further still another circuit diagram of the shift register unit provided by some embodiments of the present disclosure.

As illustrated in FIG. 8, some embodiments of the present disclosure further provide a shift register unit 10. Compared the shift register unit 10 illustrated in FIG. 8 with the shift register unit 10 illustrated in FIG. 6, the output circuit 300 further includes a sixteenth transistor M16. Accordingly, the noise reduction circuit 600 further includes a seventeenth transistor M17.

As illustrated in FIG. 8, a gate electrode of the sixteenth transistor M16 is connected to the first node Q, a first electrode of the sixteenth transistor M16 is connected to a fifth clock signal terminal CLKE to receive a fifth clock signal, and a second electrode of the sixteenth transistor M16 is connected to another pixel signal output terminal OUT2. For example, in a case where the level of the first node Q is a high level, the sixteenth transistor M16 is turned on, thereby allowing the fifth clock signal to be output to the pixel signal output terminal OUT2. For example, in some embodiments, the fifth clock signal input by the fifth clock signal terminal CLKE can be configured to be the same as the fourth clock signal input by the fourth clock signal terminal CLKD; and for another example, in some other embodiments, the fifth clock signal can be different from the fourth clock signal, so that the pixel signal output terminals OUT and OUT2 can respectively output different signals to improve the driving capability.

As illustrated in FIG. 8, a gate electrode of the seventeenth transistor M17 is connected to the second node QB, a first electrode of the seventeenth transistor M17 is connected to the pixel signal output terminal OUT2, and a second electrode of the seventeenth transistor M17 is connected to the sixth voltage terminal VSS6. For example, in a case where the level of the second node QB is a high level, the seventeenth transistor M17 is turned on, so that the pixel signal output terminal OUT2 can be noise-reduced through the sixth voltage terminal VSS6. It should be noted that the second electrode of the seventeenth transistor M17 can further be configured to be connected to other signal terminals, as long as the noise reduction of the pixel signal output terminal OUT2 can be implemented, which are not limited by the embodiments of the present disclosure.

Although only the examples in which the shift register unit includes two or three output terminals are shown above, those skilled in the art should understand that according to the description of the present disclosure, more output terminals can be set according to practical conditions, and the above examples should not constitute the limit to the protection scope of the present disclosure.

As described above, in the shift register units 10 provided by the embodiments of the present disclosure, the level of the control node H can be maintained through the second capacitor C2, and the level of the first node Q can be maintained through the third capacitor C3. The second capacitor C2 and/or the third capacitor C3 may be the capacitor component fabricated by a manufacturing process, for example, by fabricating a dedicated capacitor electrode. Each electrode of the capacitor may be implemented through a metal layer, a semiconductor layer (e.g., doped polysilicon) and the like. Alternatively, the second capacitor C2 and/or the third capacitor C3, can further be implemented by parasitic capacitance between the various components. The connection manner of the second capacitor C2 and/or the third capacitor C3 is not limited to the manner described above, and may be other suitable connection manners as long as the level provided to the control node H or the first node Q can be stored.

In a case where the first node Q and/or the control node H is maintained at a high level, the first electrodes of some transistors (for example, the second transistor M2, the fifteenth transistor M15, the fourth transistor M4, the fifth transistor M5, the eleventh transistor M11, and the fourteenth transistor M14) are connected to the first node Q or the control node H, and the second electrodes thereof are connected to receive low level signals. Even in a case where gate electrodes of these transistors are input with turn-off signals, because there is a voltage difference between the first electrode and the second electrode, leakage current may occur, thereby causing the effect of maintaining the level of the node Q and/or the control node H in the shift register unit 10 to get worse.

For example, as illustrated in FIG. 6, taking the control node H as an example, the first electrode of the second transistor M2 is connected to the blanking input signal terminal STU1, and the second electrode of the second transistor M2 is connected to the control node H. In a case where the control node H is at a high level and the signal input by the blanking input signal terminal STU1 is at a low level, the control node H may leak current through the second transistor M2.

Figure 9:
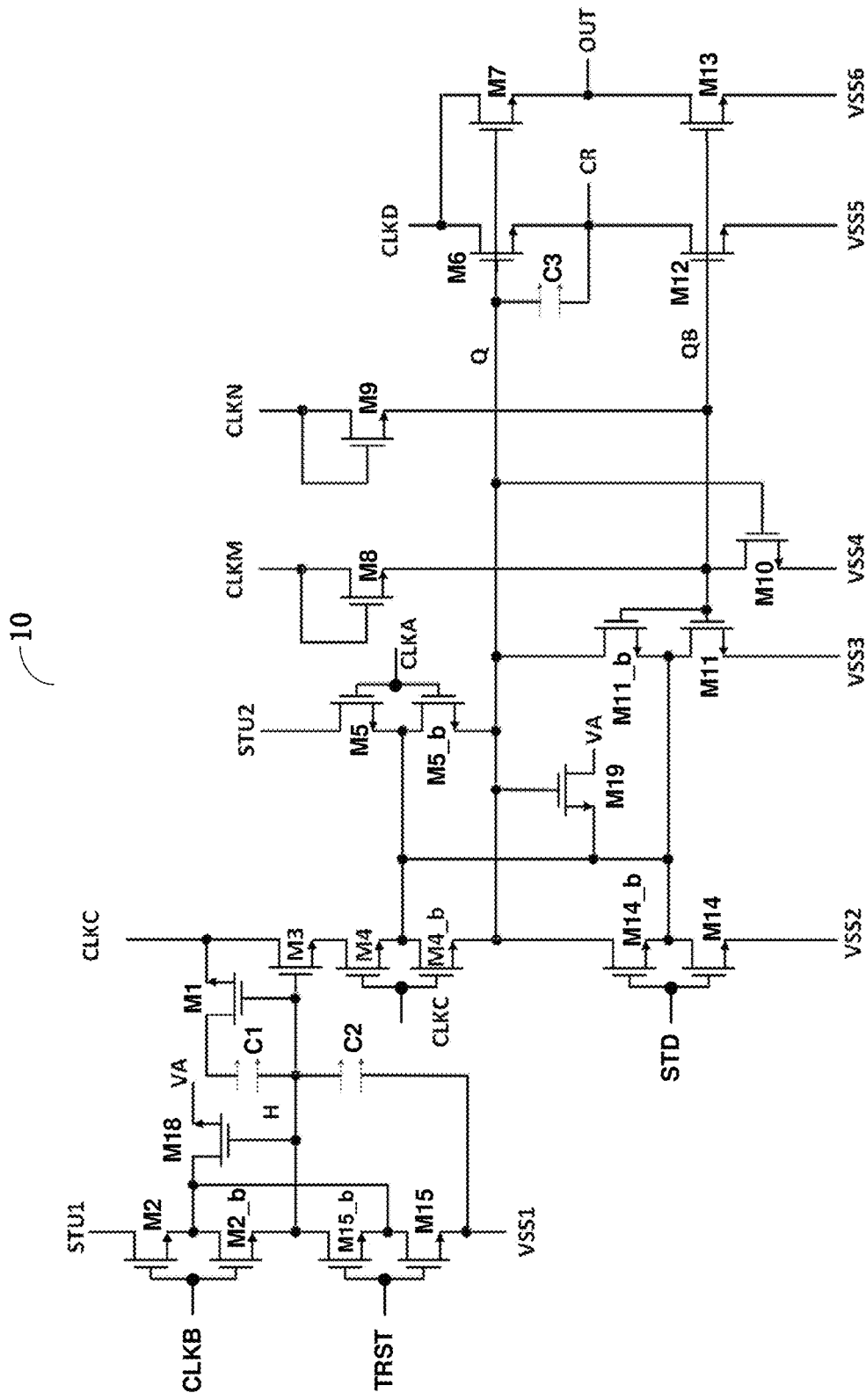
FIG. 9 is further still another circuit diagram of the shift register unit provided by some embodiments of the present disclosure.

In response to the above problems, as illustrated in FIG. 9, some embodiments of the present disclosure provide a shift register unit 10 for leakage prevention. The differences between the shift register unit 10 in FIG. 9 and the shift register unit 10 in FIG. 6 are a second leakage preventing transistor M2_b, a fourth leakage preventing transistor M4_b, a fifth leakage preventing transistor M5_b, an eleventh leakage preventing transistor M11_b, a fourteenth leakage preventing transistor M14_b, a fifteenth leakage preventing transistor M15_b, an eighteenth transistor M18, and a nineteenth transistor M19 are added. In the following, the second leakage preventing transistor M2_b will be taken as an example to describe the working principle of leakage prevention.

A gate electrode of the second leakage preventing transistor M2_b is connected to the second clock signal terminal CLKB, a first electrode of the second leakage preventing transistor M2_b is connected to the second electrode of the eighteenth transistor M18, and a second electrode of the second leakage preventing transistor M2_b is connected to the control node H. A gate electrode of the eighteenth transistor M18 is connected to the control node H, and a first electrode of the eighteenth transistor M18 is connected to a ninth voltage terminal VA to receive a ninth voltage of a high level. In a case where the control node H is at a high level, the eighteenth transistor M18 is turned on under control of the level of the control node H, so that the high-level signal input by the ninth voltage terminal VA can be input to the first electrode of the second leakage preventing transistor M2_b, and cause both the first electrode of the second leakage preventing transistor M2_b and the second electrode of the second leakage preventing transistor M2_b to be at a high level, so that the charge at the control node H can be prevented from leaking through the second leakage preventing transistor M2_b. At that time, because the gate electrode of the second leakage preventing transistor M2_b and the gate electrode of the second transistor M2 are connected, the combination of the second transistor M2 and the second leakage preventing transistor M2_b can implement the same effect as the second transistor M2 described above and simultaneously can have an effect of preventing leakage.

Similarly, the combination of the fifteenth leakage preventing transistor M15_b and the eighteenth transistor M18 can prevent the charge at the control node H from leaking through the fifteenth leakage preventing transistor M15_b and the fifteenth transistor M15. Similarly, the fourth leakage preventing transistor M4_b, the fifth leakage preventing transistor M5_b, the eleventh leakage preventing transistor M11_b, and the fourteenth leakage preventing transistor M14_b can implement the leakage preventing structure in combination with the nineteenth transistor M19, respectively, thereby preventing the charge at the first node Q from leaking. The working principle of preventing leakage at the first node Q is the same as the working principle of preventing leakage at the control node H described above, and details are not described herein again.

It should be noted that each of the transistors used in the embodiments of the present disclosure may be a thin film transistor, a field effect transistor or other switching component having the same characteristics. In the embodiments of the present disclosure, the thin film transistor is taken as an example for description. The source electrode and drain electrode of the transistor used here may be structurally symmetrical, so that the source electrode and the drain electrode may be structurally indistinguishable. In the embodiments of the present disclosure, in order to distinguish the two electrodes of the transistor except the gate electrode, one electrode is directly described as the first electrode, and the other electrode is described as the second electrode. In addition, the transistors can be divided into N-type and P-type transistors according to the characteristics of the transistors. In a case where the transistor is the P-type transistor, the turn-on voltage is a low level voltage (e.g., 0V, −5V, −10V, or other suitable voltage), and the turn-off voltage is a high level voltage (e.g., 5V, 10V, or other suitable voltage). In a case where the transistor is the N-type transistor, the turn-on voltage is a high level voltage (for example, 5V, 10V or other suitable voltage), and the turn-off voltage is a low level voltage (for example, 0V, −5V, −10V or other suitable voltage).

In addition, it should be noted that the transistors used in the shift register unit 10 provided by the embodiments of the present disclosure are all described by taking the N-type transistor as an example. The embodiments of the present disclosure include but are not limited thereto, and for example, at least some of the transistors in the shift register unit 10 may also use the P-type transistor.

Figure 10:
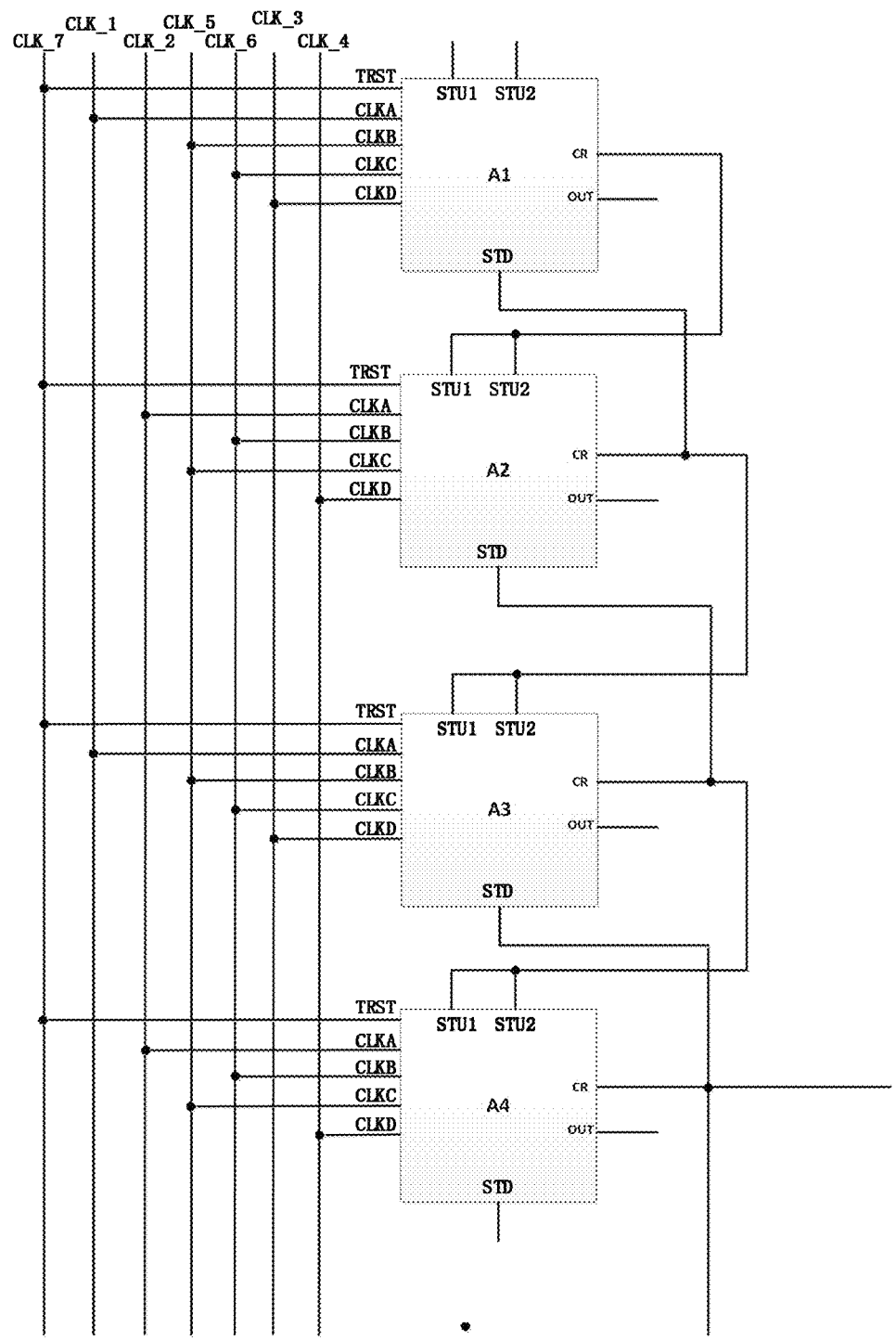
FIG. 10 is a schematic diagram of a gate driving circuit provided by some embodiments of the present disclosure.

Some embodiments of the present disclosure provide a gate driving circuit 20. As illustrated in FIG. 10, the gate driving circuit 20 includes a plurality of cascaded shift register units 10, and any one or more of the shift register units 10 can use the structure of the shift register unit 10 provided by the embodiment of the present disclosure or a modification thereof. It should be noted that only the first four shift register units (A1, A2, A3, and A4) of the gate driving circuit 20 are schematically illustrated in FIG. 10.

As illustrated in FIG. 10, the gate driving circuit 20 further includes a first sub-clock signal line CLK_1, a second sub-clock signal line CLK_2, a third sub-clock signal line CLK_3, and a fourth sub-clock signal line CLK_4. In a case where the shift register unit is connected to the first clock signal terminal CLKA and the fourth clock signal terminal CLKD, a (2n−1)th shift register unit is connected to the first sub-clock signal line CLK_1 to receive the first clock signal, and for example, is connected to the first sub-clock signal line CLK_1 through the first clock signal terminal CLKA; and the (2n−1)th shift register unit is connected to the third sub-clock signal line CLK_3 to receive the fourth clock signal, and for example, is connected to the third sub-clock signal line CLK_3 through the fourth clock signal terminal CLKD. A (2n)th shift register unit is connected to the second sub-clock signal line CLK_2 to receive the first clock signal, and for example, is connected to the second sub-clock signal line CLK_2 through the first clock signal terminal CLKA; the (2n)th shift register unit is connected to the fourth sub-clock signal line CLK_4 to receive the fourth clock signal, and for example, is connected to the fourth sub-clock signal line CLK_4 through the fourth clock signal terminal CLKD; and n is an integer greater than zero.

As illustrated in FIG. 10, the gate driving circuit 20 further includes a fifth sub-clock signal line CLK_5, a sixth sub-clock signal line CLK_6, and a seventh sub-clock signal line CLK_7. In a case where the shift register unit is connected to the second clock signal terminal CLKB, the third clock signal terminal CLKC, and the total reset signal terminal TRST, the (2n−1)th shift register unit is connected to the fifth sub-clock signal line CLK_5 to receive the second clock signal, and for example, is connected to the fifth sub-clock signal line CLK_5 through the second clock signal terminal CLKB; and the (2n−1)th shift register unit is connected to the sixth sub-clock signal line CLK_6 to receive the third clock signal, and for example is connected to the sixth sub-clock signal line CLK_6 through the third clock signal terminal CLKC. The (2n)th shift register unit is connected to the sixth sub-clock signal line CLK_6 to receive the second clock signal, and for example, is connected to the sixth sub-clock signal line CLK_6 through the second clock signal terminal CLKB; and the (2n)th shift register unit is connected to the fifth sub-clock signal line CLK_5 to receive the third clock signal, and for example, is connected to the fifth sub-clock signal line CLK_5 through the second clock signal terminal CLKB. Each shift register unit is connected to the seventh sub-clock signal line CLK_7 to receive the total reset signal, and for example, is connected to the seventh sub-clock signal line CLK_7 through the total reset signal terminal TRST; and n is an integer greater than zero.

As illustrated in FIG. 10, except for the first shift register unit, the blanking input signal terminal STU1 and the display input signal terminal STU2 of each of the remaining shift register units are connected to the shift signal output terminal CR of a previous shift register unit; and except for the last shift register unit, the display reset signal terminal STD of each of the remaining shift register units is connected to the shift signal output terminal CR of a next shift register unit.

Figure 11:
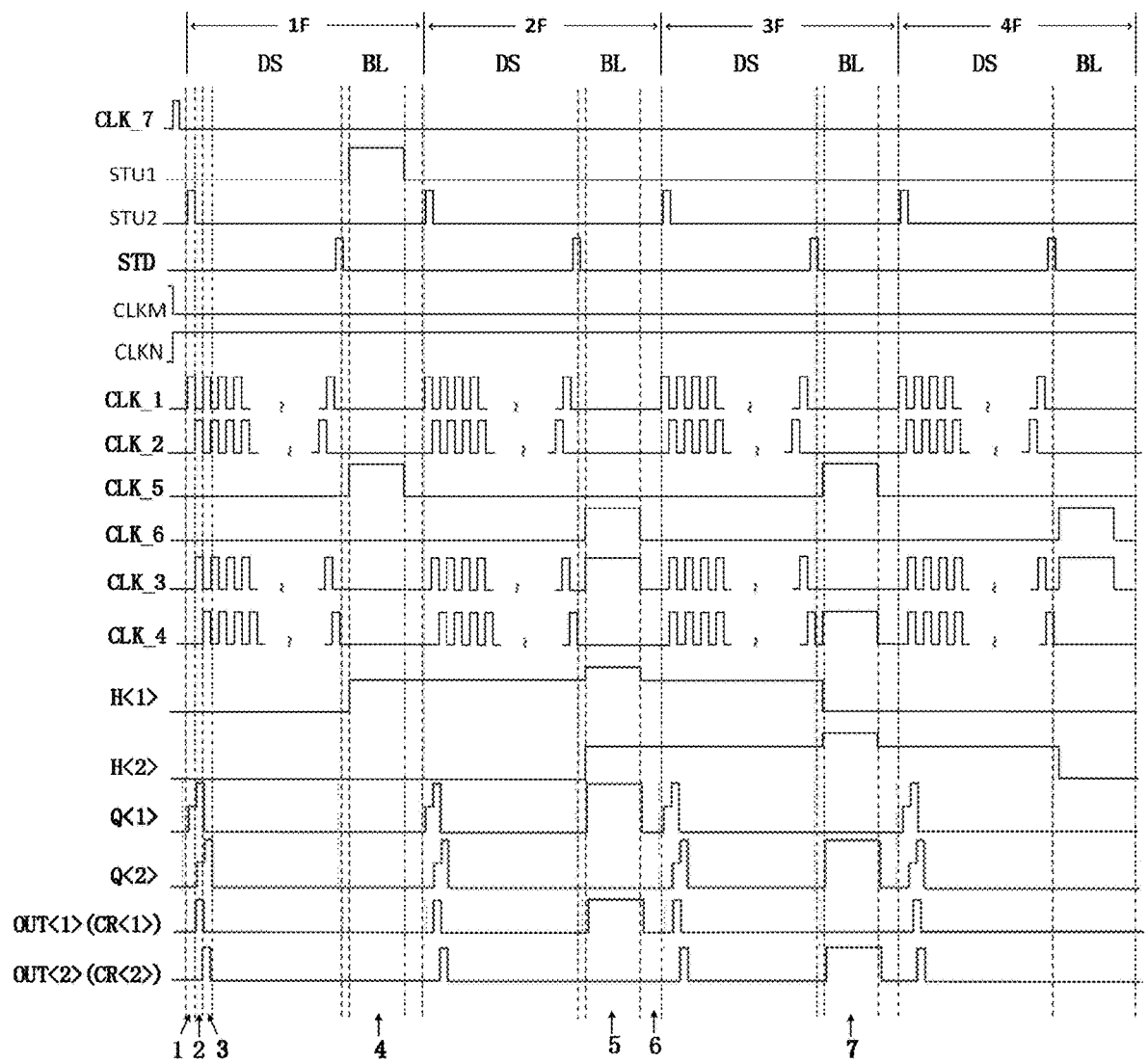
FIG. 11 is a timing diagram of signals corresponding to the gate driving circuit illustrated in FIG. 10 in operation provided by some embodiments of the present disclosure.

FIG. 11 is a timing diagram of signals corresponding to the gate driving circuit 20 illustrated in FIG. 10 in operation. In FIG. 11, H<1> and H<2> respectively indicate control nodes H in the first shift register unit and the second shift register unit in the gate driving circuit 20, and Q<1> and Q<2> respectively indicate the first nodes Q in the first shift register unit and the second shift register unit in the gate driving circuit 20. OUT<1> (CR<1>) and OUT<2> (CR<2>) respectively indicate pixel signal output terminals OUT (shift signal output terminals CR) in the first shift register unit and the second shift register unit in the gate driving circuit 20. 1F, 2F, 3F, and 4F indicate the first frame, the second frame, the third frame, and the fourth frame, respectively. DS indicates the display phase of one frame, and BL indicates the blanking phase of one frame. It should be noted that STU1 and STU2 in FIG. 11 respectively indicate the blanking input signal terminal and the display input signal terminal in the first shift register unit, and STD indicates the display reset signal terminal in the last shift register unit.

In addition, it should be noted that as illustrated in FIG. 11, in the first frame 1F, the second frame 2F, the third frame 3F, and the fourth frame 4F, the seventh voltage terminal CLKM is input with a low level voltage, and the eighth voltage terminal CLKN is input with a high level voltage, but the embodiments of the present disclosure are not limited thereto. As described above, the seventh voltage terminal CLKM and the eighth voltage terminal CLKN can be configured to alternately input a high-level voltage, that is, in some frames, the seventh voltage terminal CLKM can be input with a high-level voltage and the eighth voltage terminal CLKN can be input with a low-level voltage. The signal levels in the signal timing diagram illustrated in FIG. 11 are only illustrative and do not represent real level values.

In the following, the working principle of the gate driving circuit 20 illustrated in FIG. 10 will be described with reference to the signal timing diagram in FIG. 11. For example, the shift register unit in the gate driving circuit 20 illustrated in FIG. 10 may use the shift register unit illustrated in FIG. 6.

Prior to the start of the first frame 1F, the seventh sub-clock signal line CLK_7 provides a high-level signal. Because the total reset signal terminal TRST of each shift register unit is connected to the seventh sub-clock signal line CLK_7, the fifteenth transistor M15 in each shift register unit is turned on so that the control node H in each shift register unit can be reset to implement the total reset.

Because the seventh voltage terminal CLKM is input with a high-level signal, the eighth transistor M8 is turned on, so that the level of the second node QB is charged to a high level. The high level of the second node QB causes the eleventh transistor M11 to be turned on, thereby pulling down the level of the first node Q to a low level.

In the display phase DS of the first frame 1F, the operation of the first shift register unit is described as follows.

In a first phase 1, the display input signal terminal STU2 of the first shift register unit is input with a high-level signal, and simultaneously because the first clock signal terminal CLKA (connected to the first sub-clock signal line CLK_1) is input with a high-level signal, the fifth transistor M5 is turned on, so that the high-level signal input by the display input signal terminal STU2 can charge the first node Q<1> through the fifth transistor M5, thereby causing the level of the first node Q<1> to be pulled up to a high level and to be maintained by the third capacitor C3. The sixth transistor M6 and the seventh transistor M7 are turned on under control of the first node Q<1>, but because the fourth clock signal terminal CLKD (connected to the third sub-clock signal line CLK3) is input a low-level signal in this phase, both the shift signal output terminal CR<1> and the pixel signal output terminal OUT<1> output low-level signals. In this phase, the first node Q<1> is pre-charged.

In a second phase 2, the fourth clock signal terminal CLKD is input with a high-level signal, and the level of the first node Q<1> is further pulled up because of a bootstrap effect, so the sixth transistor M6 and the seventh transistor M7 keep being turned on, so that both the shift signal output terminal CR<1> and the pixel signal output terminal OUT<1> output high-level signals. For example, the high-level signal output by the shift signal output terminal CR<1> can be used for scanning shift of adjacent shift register units, and the high-level signal output by the pixel signal output terminal OUT<1> can be used to drive the sub-pixel unit in the display panel to perform display.

In a third phase 3, because the display reset signal terminal STD of the first shift register unit is connected to the shift signal output terminal CR<2> of the second shift register unit, the shift signal output terminal CR<2> of the second shift register unit outputs a high-level signal in this phase. Therefore, the display reset signal terminal STD of the first shift register unit is input with a high-level signal, the fourteenth transistor M14 is turned on, the level of the first node Q<1> is pulled down to a low level, and the first node Q<1> is reset. Because the first node Q<1> is at the low level, the tenth transistor M10 is turned off, and the high-level signal input by the eighth voltage terminal CLKN can charge the second node QB. The level of the second node QB is charged to a high level, so that the eleventh transistor M11 is turned on to further perform noise reduction on the first node Q<1>. Simultaneously, the twelfth transistor M12 and the thirteenth transistor M13 are turned on, and the level at the shift signal output terminal CR<1> and the level at the pixel signal output terminal OUT<1> are pulled down to a low level to be reset.

After the first shift register unit drives the sub-pixels in the first row in the display panel to complete the display, accordingly, the second shift register unit, the third shift register unit and the like progressively drive the sub-pixel units in the display panel to complete the display driving of one frame. Here, the display phase of the first frame ends.

In the blanking phase BL of the first frame 1F, the operation of the first shift register unit is described as follows.

In a fourth phase 4, the blanking input signal terminal STU1 of the first shift register unit is input with a high-level signal, and simultaneously, because the second clock signal terminal CLKB (connected to the fifth sub-clock signal line CLK_5) is input with a high-level signal, the second transistor M2 is turned on. Therefore, the high-level signal input by the blanking input signal terminal STU1 can charge the control node H<1> through the second transistor M2, so that the level of the control node H<1> is pulled up to a high level and the level is maintained by the second capacitor C2. Because the eighth voltage terminal CLKN is input with a high-level signal in this phase, the level of the second node QB is charged to a high level by the high-level signal, and the eleventh transistor M11 is turned on, so that the level of the first node Q<1> is pulled down to a low level. In addition, in this phase, the third clock signal terminal CLKC (connected to the sixth sub-clock signal line CLK_6) is input with a low-level signal, so the fourth transistor M4 keeps being turned off and the fourth transistor M4 isolates the influence of the control node H<1> on the first node Q<1>, thereby causing the first node Q<1> to be at a low level. In this phase, the control node H is pre-charged.

In the display phase DS of the second frame 2F, the gate driving circuit 20 repeats the same operation as that in the display phase DS of the first frame 1F, and details are not described herein again.

In the blanking phase BL of the second frame 2F, the operation of the gate driving circuit 20 is described as follows.

In a fifth phase 5, for the first shift register unit, the control node H<1> is at a high-level because of the storage function of the second capacitor C2, and the third transistor M3 is turned on. The third clock signal terminal CLKC (connected to the sixth sub-clock signal line CLK_6) is input with a high-level signal to allow the fourth transistor M4 to be turned on, so the high-level signal input by the third clock signal terminal CLKC can charge the first node Q<1> through the third transistor M3 and the fourth transistor M4 to pull up the level of the first node Q<1> to a high level. Simultaneously, because the control node H<1> is at a high level, the first transistor M1 is turned on, and the high-level signal input by the third clock signal terminal CLKC can pull up, by coupling, the level of the control node H<1> through the first capacitor C1, so that the level of the control node H<1> is further pulled up. The third transistor M3 can be turned on more sufficiently by pulling up, by coupling, the level of the control node H<1>, so that the high-level signal input by the third clock signal terminal CLKC can charge the first node Q more sufficiently.

Because the first node Q is at a high level, the sixth transistor M6 and the seventh transistor M7 are turned on, and the high-level signal input by the fourth clock signal terminal CLKD (connected to the third sub-clock signal line CLK_3) can be output to the shift signal output terminal CR<1> and the pixel signal output terminal OUT<1>. For example, the signal output by the shift signal output terminal CR<1> can be used for the scanning shift of adjacent shift register units, and the signal output by the pixel signal output terminal OUT can be used to drive the sensing transistor in the sub-pixel unit in the display panel to implement the external compensation.

Simultaneously, in the fifth phase 5, because the second clock signal terminal CLKB of the second shift register unit is connected to the sixth sub-clock signal line CLK6, the blanking input signal terminal STU1 of the second shift register unit is connected to the shift signal output terminal CR<1> of the first shift register unit, and the second transistor M2 in the second shift register unit is turned on, so that the level of the control node H<2> in the second shift register unit is pulled up to a high level and is stayed at the high level.

In a sixth phase 6, for the first shift register unit, because the signal input by the fourth clock signal terminal CLKD (connected to the third sub-clock signal line CLK_3) changes from a high-level signal to a low-level signal, the signal output by the shift signal output terminal CR<1> changes from a high-level signal to a low-level signal, and the level of the first node Q<1> is pulled down through the coupling action of the third capacitor C3. In a case where the level of the first node Q<1> changes to a low level, the high-level signal input by the eighth voltage terminal CLKN charges the level of the second node QB to a high level, and the high level of the second node QB causes the eleventh transistor M11 to be turned on, so that the level of the first node Q<1> is further pulled down to complete the reset of the first node Q<1>.

In the display phase DS of the third frame 3F, the gate driving circuit 20 repeats the same operation as that in the display phase DS of the first frame 1F, and details are not described herein again.

In the blanking phase BL of the third frame 3F, the operation of the gate driving circuit 20 is described as follows.

In a seventh phase 7, for the first shift register unit, the second clock signal terminal CLKB (connected to the fifth sub-clock signal line CLK_5) is input with a high-level signal, and the second transistor M2 is turned on. But in this phase, because the blanking input signal terminal STU1 is at a low level, the control node H can be discharged through the second transistor M2, so that the level of the control node H is pulled down to a low level to complete the reset.

The operation of the second shift register unit in the seventh phase 7 can be with reference to the corresponding operation of the first shift register unit in the fifth phase 5, and details are not described herein again.

Here, the driving timing of the third frame 3F ends. The driving method of the gate driving circuit in the subsequent phases such as in the fourth frame, the fifth frame, and the like can be with reference to the above description, and details are not described herein again.

As described above, by setting the coupling circuit 400, in a case where the control node H is at a high level, the level of the control node H can be further pulled up by coupling, so that the first node Q can be charged more sufficiently in the blanking phase of one frame to avoid the abnormal output.

Figure 15:
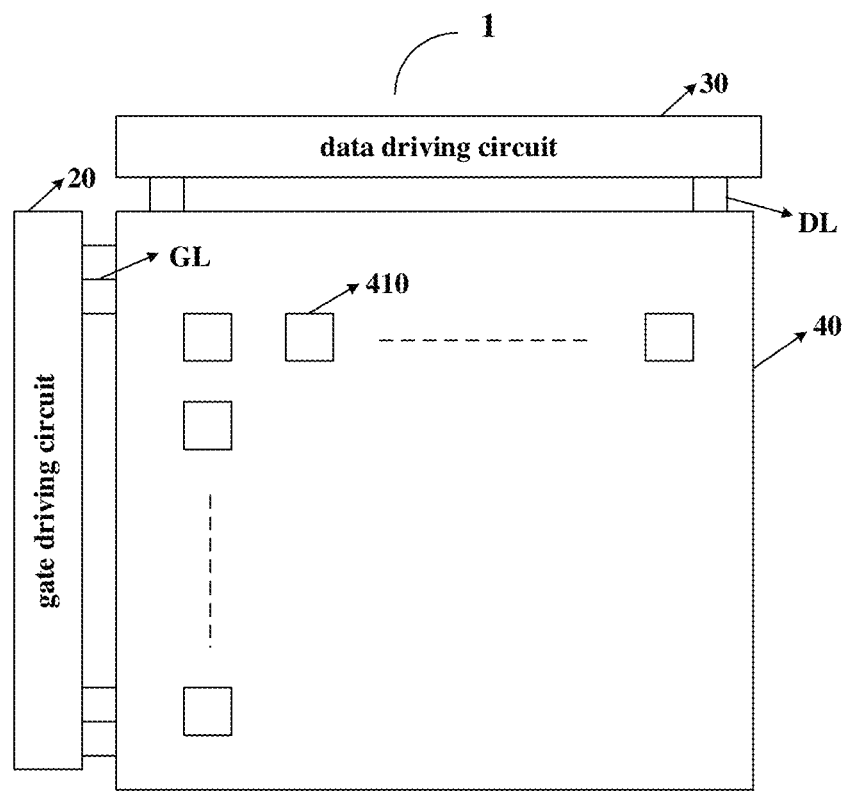
FIG. 15 is a schematic diagram of a display device provided by some embodiments of the present disclosure.

The embodiments of the present disclosure further provide a display device 1, and as illustrated in FIG. 15, the display device 1 includes the gate driving circuit 20 provided by the embodiment of the present disclosure. The display device 1 further includes a display panel 40, and the display panel 40 includes an array including a plurality of sub-pixel units 410. For example, the display device 1 further includes a data driving circuit 30. The data driving circuit 30 is configured to provide data signals to the pixel array; and the gate driving circuit 20 is configured to provide driving signals to the pixel array, and for example, the driving signal can drive the scanning transistor and the sensing transistor in the sub-pixel unit 410. The data driving circuit 30 is electrically connected to the sub-pixel unit 410 through the data line DL, and the gate driving circuit 20 is electrically connected to the sub-pixel unit 410 through the gate line GL.

It should be noted that the display device 1 in the present embodiments may be: a liquid crystal panel, a liquid crystal television, a display screen, an OLED panel, an OLED television, an electronic paper display device, a mobile phone, a tablet computer, a notebook computer, a digital photo frame, a navigator, or any product or component with the display function.

The technical effects of the display device 1 provided by the embodiments of the present disclosure can be with reference to the corresponding description of the gate driving circuit 20 in the above embodiments, and details are not described herein again.

The embodiments of the present disclosure further provide a driving method that can be used to drive the shift register unit 10 provided by the embodiment of the present disclosure, and the driving method includes: in a blanking phase of one frame, causing the coupling circuit 400 to control (e.g., pull up), by coupling, the level of the control node H in response to the blanking signal, causing the blanking input circuit 100 to input the blanking signal to the first node Q, and causing the output circuit 300 to output the composite output signal under control of the level of the first node Q.

The embodiments of the present disclosure further provide a driving method that can be used to drive the shift register unit 10 provided by the embodiment of the present disclosure, and the driving method includes the following steps.

In the display phase of the first frame, the display input circuit 200 inputs the display signal to the first node Q in response to the first clock signal, and the output circuit 300 outputs the first output signal under control of the level of the first node Q.

In the blanking phase of the first frame, the blanking input circuit 100 inputs the blanking input signal to the control node H.

In the blanking phase of the second frame, the coupling circuit 400 controls (e.g., pulls up), by coupling, the level of the control node H in response to the blanking signal, the blanking input circuit 100 inputs the blanking signal to the first node Q, and the output circuit 300 outputs the second output signal under control of the level of the first node Q. The composite output signal includes the first output signal and the second output signal.

It should be noted that the detailed description and technical effects of the driving method provided by the embodiments of the present disclosure may be with reference to the description of the working principle of the shift register unit 10 and the gate driving circuit 20 in the embodiments of the present disclosure, and details are not described herein again.

What have been described above are only specific implementations of the present disclosure, the protection scope of the present disclosure is not limited thereto, and the protection scope of the present disclosure should be based on the protection scope of the claims.

What is claimed is:

1. A shift register unit, comprising a blanking input circuit, a display input circuit, an output circuit, and a coupling circuit,
    wherein the blanking input circuit is configured to input a blanking input signal to a control node and is configured to input a blanking signal to a first node in a blanking phase of one frame;
    the display input circuit is configured to input a display signal to the first node in a display phase of one frame in response to a first clock signal;
    the output circuit is configured to output a composite output signal to an output terminal under control of a level of the first node;
    the coupling circuit is electrically connected to the control node and is configured to control, by coupling, a level of the control node in response to the blanking signal;
    the display input circuit comprises a fifth transistor; and
    a gate electrode of the fifth transistor is connected to a first clock signal terminal to receive the first clock signal, a first electrode of the fifth transistor is connected to a display input signal terminal to receive the display signal, and a second electrode of the fifth transistor is connected to the first node.

2. The shift register unit according to claim 1, wherein the coupling circuit comprises a first capacitor; and
    a first electrode of the first capacitor is connected to a third clock signal terminal to receive a third clock signal and the third clock signal is used as the blanking signal, and a second electrode of the first capacitor is connected to the control node.

3. The shift register unit according to claim 1, wherein the coupling circuit comprises a first capacitor and a first transistor; and
    a gate electrode of the first transistor is connected to the control node, a first electrode of the first transistor is connected to a third clock signal terminal to receive a third clock signal and the third clock signal is used as the blanking signal, a second electrode of the first transistor is connected to a first electrode of the first capacitor, and a second electrode of the first capacitor is connected to the control node.

4. The shift register unit according to claim 1, wherein the blanking input circuit comprises:
a charging sub-circuit, configured to input the blanking input signal to the control node in response to a second clock signal;
a storage sub-circuit, configured to store the blanking input signal input by the charging sub-circuit; and
an isolation sub-circuit, configured to input the blanking signal to the first node under control of the level of the control node and a third clock signal.

5. The shift register unit according to claim 4,
wherein the charging sub-circuit comprises a second transistor, a gate electrode of the second transistor is connected to a second clock signal terminal to receive the second clock signal, a first electrode of the second transistor is connected to a blanking input signal terminal to receive the blanking input signal, and a second electrode of the second transistor is connected to the control node;
the storage sub-circuit comprises a second capacitor, a first electrode of the second capacitor is connected to the control node, and a second electrode of the second capacitor is connected to a first voltage terminal to receive a first voltage; and
the isolation sub-circuit comprises a third transistor and a fourth transistor, a gate electrode of the third transistor is connected to the control node, a first electrode of the third transistor is connected to a third clock signal terminal to receive the third clock signal and the third clock signal is used as the blanking signal, a second electrode of the third transistor is connected to a first electrode of the fourth transistor, a gate electrode of the fourth transistor is connected to the third clock signal terminal to receive the third clock signal, and a second electrode of the fourth transistor is connected to the first node.

6. The shift register unit according to claim 1,
wherein the output terminal comprises a shift signal output terminal and a pixel signal output terminal, the shift signal output terminal and the pixel signal output terminal output the composite output signal, and the output circuit comprises a sixth transistor, a seventh transistor, and a third capacitor;
a gate electrode of the sixth transistor is connected to the first node, a first electrode of the sixth transistor is connected to a fourth clock signal terminal to receive a fourth clock signal and the fourth clock signal is used as the composite output signal, and a second electrode of the sixth transistor is connected to the shift signal output terminal;
a gate electrode of the seventh transistor is connected to the first node, a first electrode of the seventh transistor is connected to the fourth clock signal terminal to receive the fourth clock signal and the fourth clock signal is used as the composite output signal, and a second electrode of the seventh transistor is connected to the pixel signal output terminal; and
a first electrode of the third capacitor is connected to the first node, and a second electrode of the third capacitor is connected to the second electrode of the sixth transistor.

7. The shift register unit according to claim 6, further comprising a noise reduction circuit and a control circuit,
wherein the control circuit is configured to control a level of a second node under control of the level of the first node; and
the noise reduction circuit is configured to perform noise reduction on the first node, the shift signal output terminal, and the pixel signal output terminal under control of the level of the second node.

8. The shift register unit according to claim 7, wherein the control circuit comprises an eighth transistor, a ninth transistor, and a tenth transistor;
a gate electrode of the eighth transistor and a first electrode of the eighth transistor are connected and are configured to be connected to a seventh voltage terminal to receive a seventh voltage, and a second electrode of the eighth transistor is connected to the second node;
a gate electrode of the ninth transistor and a first electrode of the ninth transistor are connected and are configured to be connected to an eighth voltage terminal to receive an eighth voltage, and a second electrode of the ninth transistor is connected to the second node; and
a gate electrode of the tenth transistor is connected to the first node, a first electrode of the tenth transistor is connected to the second node, and a second electrode of the tenth transistor is connected to a fourth voltage terminal to receive a fourth voltage.

9. The shift register unit according to claim 7, wherein the noise reduction circuit comprises an eleventh transistor, a twelfth transistor, and a thirteenth transistor;
a gate electrode of the eleventh transistor is connected to the second node, a first electrode of the eleventh transistor is connected to the first node, and a second electrode of the eleventh transistor is connected to a third voltage terminal to receive a third voltage;
a gate electrode of the twelfth transistor is connected to the second node, a first electrode of the twelfth transistor is connected to the shift signal output terminal, and a second electrode of the twelfth transistor is connected to a fifth voltage terminal to receive a fifth voltage; and
a gate electrode of the thirteenth transistor is connected to the second node, a first electrode of the thirteenth transistor is connected to the pixel signal output terminal, and a second electrode of the thirteenth transistor is connected to a sixth voltage terminal to receive a sixth voltage.

10. The shift register unit according to claim 1, further comprising a display reset circuit, wherein the display reset circuit is configured to reset the first node in response to a display reset signal.

11. The shift register unit according to claim 10, wherein the display reset circuit comprises a fourteenth transistor; and
a gate electrode of the fourteenth transistor is connected to a display reset signal terminal to receive the display reset signal, a first electrode of the fourteenth transistor is connected to the first node, and a second electrode of the fourteenth transistor is connected to a second voltage terminal to receive a second voltage.

12. The shift register unit according to claim 1, further comprising a total reset circuit, wherein the total reset circuit is configured to reset the control node in response to a total reset signal.

13. The shift register unit according to claim 12, wherein the total reset circuit comprises a fifteenth transistor; and
a gate electrode of the fifteenth transistor is connected to a total reset signal terminal to receive the total reset signal, a first electrode of the fifteenth transistor is connected to the control node, and a second electrode of the fifteenth transistor is connected to a first voltage terminal to receive a first voltage.

14. A gate driving circuit, comprising a plurality of cascaded shift register units according to claim 1.

15. The gate driving circuit according to claim 14, further comprising a first sub-clock signal line, a second sub-clock signal line, a third sub-clock signal line, and a fourth sub-clock signal line,
- wherein a (2n−1)th shift register unit is connected to the first sub-clock signal line to receive a first clock signal, and the (2n−1)th shift register unit is connected to the third sub-clock signal line to receive a fourth clock signal;
- a (2n)th shift register unit is connected to the second sub-clock signal line to receive a first clock signal, and the (2n)th shift register unit is connected to the fourth sub-clock signal line to receive a fourth clock signal; and
- n is an integer greater than zero.

16. The gate driving circuit according to claim 15, further comprising a fifth sub-clock signal line, a sixth sub-clock signal line, and a seventh sub-clock signal line,
- wherein the (2n−1)th shift register unit is connected to the fifth sub-clock signal line to receive a second clock signal, and the (2n−1)th shift register unit is connected to the sixth sub-clock signal line to receive a third clock signal;
- the (2n)th shift register unit is connected to the sixth sub-clock signal line to receive a second clock signal, and the (2n)th shift register unit is connected to the fifth sub-clock signal line to receive a third clock signal;
- each shift register unit is connected to the seventh sub-clock signal line to receive a total reset signal; and
- n is an integer greater than zero.

17. A display device, comprising the gate driving circuit according to claim 14.

18. A driving method of the shift register unit according to claim 1, comprising:
- in the blanking phase of one frame, causing the coupling circuit to control, by coupling, the level of the control node in response to the blanking signal, causing the blanking input circuit to input the blanking signal to the first node, and causing the output circuit to output the composite output signal under control of the level of the first node.

19. A display device, comprising the gate driving circuit according to claim 16.

* * * * *